United States Patent
Pfahler et al.

(10) Patent No.: US 11,255,606 B2
(45) Date of Patent: Feb. 22, 2022

(54) GAS FLOW CONTROL FOR MILLISECOND ANNEAL SYSTEM

(71) Applicants: Mattson Technology, Inc., Fremont, CA (US); Beijing E-Town Semiconductor Technology Co., Ltd., Beijing (CN)

(72) Inventors: Christian Pfahler, Ulm (DE); Joseph Cibere, Burnaby (CA)

(73) Assignees: Mattson Technology, Inc., Fremont, CA (US); Beijing E-Town Semiconductor Technology Co., Ltd., Beijing (CN)

( * ) Notice: Subject to any disclaimer, the term of this patent is extended or adjusted under 35 U.S.C. 154(b) by 373 days.

(21) Appl. No.: 15/386,538

(22) Filed: Dec. 21, 2016

(65) Prior Publication Data
US 2017/0191759 A1    Jul. 6, 2017

Related U.S. Application Data

(60) Provisional application No. 62/272,804, filed on Dec. 30, 2015.

(51) Int. Cl.
  *F27B 17/00* (2006.01)
  *H01J 37/32* (2006.01)
  (Continued)

(52) U.S. Cl.
  CPC .... *F27B 17/0025* (2013.01); *H01J 37/32055* (2013.01); *H01L 21/6719* (2013.01);
  (Continued)

(58) Field of Classification Search
  CPC ............ F27B 17/0025; H01J 37/32055; H01J 37/226; H01J 37/32522; H01J 37/3244;
  (Continued)

(56) References Cited

U.S. PATENT DOCUMENTS 4,649,261 A * 3/1987 Sheets ................. F27B 17/0025
                                                118/50.1
4,698,486 A * 10/1987 Sheets ................. F27B 17/0025
                                                118/50.1
(Continued)

FOREIGN PATENT DOCUMENTS

CN    102165607    8/2011
CN    104051306    7/2019
(Continued)

OTHER PUBLICATIONS

Ragnarsson et al., "The Importance of Moisture Control for EOT Scaling of Hf-Based Dielectrics," *Journal of the Electrochemical Society*, vol. 156, Issue 6, Apr. 3, 2009, pp. H416-H423.
(Continued)

*Primary Examiner* — Eric S Stapleton
(74) *Attorney, Agent, or Firm* — Dority & Manning, P.A.

(57) ABSTRACT

Systems and methods for gas flow in a thermal processing system are provided. In some example implementations a gas flow pattern inside the process chamber of a millisecond anneal system can be improved by implementing one or more of the following: (1) altering the direction, size, position, shape and arrangement of the gas injection inlet nozzles, or a combination hereof; (2) use of gas channels in a wafer plane plate connecting the upper chamber with the lower chamber of a millisecond anneal system; and/or (3) decreasing the effective volume of the processing chamber using a liner plate disposed above the semiconductor substrate.

14 Claims, 18 Drawing Sheets

(51) Int. Cl.
  *H01L 21/67* (2006.01)
  *H01J 37/22* (2006.01)
(52) U.S. Cl.
  CPC .. *H01L 21/67109* (2013.01); *H01L 21/67115* (2013.01); *H01L 21/67248* (2013.01); *H01J 37/226* (2013.01); *H01J 37/3244* (2013.01); *H01J 37/32522* (2013.01)
(58) Field of Classification Search
  CPC ......... H01L 21/67109; H01L 21/67115; H01L 21/6719; H01L 21/67248
  USPC ....................................................... 392/416
  See application file for complete search history.

(56) References Cited

U.S. PATENT DOCUMENTS

| | | | | |
|---|---|---|---|---|
| 4,926,793 | A * | 5/1990 | Arima | C23C 8/36 118/715 |
| 4,956,538 | A * | 9/1990 | Moslehi | G01J 5/0003 219/121.6 |
| 5,155,336 | A * | 10/1992 | Gronet | C23C 16/481 219/390 |
| 5,259,883 | A * | 11/1993 | Yamabe | C23C 16/46 118/724 |
| 5,436,172 | A * | 7/1995 | Moslehi | B24B 37/013 374/121 |
| 5,446,824 | A * | 8/1995 | Moslehi | H01L 21/67115 118/50.1 |
| 5,446,825 | A * | 8/1995 | Moslehi | C23C 16/481 118/724 |
| 5,478,608 | A * | 12/1995 | Gorokhovsky | C23C 16/02 118/50.1 |
| 5,587,207 | A * | 12/1996 | Gorokhovsky | C23C 16/02 118/50 |
| 5,753,320 | A * | 5/1998 | Mikoshiba | C23C 16/452 118/719 |
| 5,981,075 | A * | 11/1999 | Ohmi | C23C 14/0694 204/192.26 |
| 6,015,503 | A * | 1/2000 | Butterbaugh | B08B 7/0057 134/1.3 |
| 6,016,383 | A * | 1/2000 | Gronet | C23C 16/481 219/405 |
| 6,080,965 | A * | 6/2000 | Osawa | H01L 21/67115 118/725 |
| 6,081,072 | A * | 6/2000 | Suzuki | H01L 21/67115 219/405 |
| 6,110,316 | A * | 8/2000 | Kobayashi | B41M 3/12 156/230 |
| 6,204,203 | B1 * | 3/2001 | Narwankar | H01L 29/513 438/785 |
| 6,300,601 | B1 * | 10/2001 | Suzuki | H01L 21/67115 118/724 |
| 6,337,467 | B1 * | 1/2002 | Sik | H01L 21/67115 219/411 |
| 6,391,690 | B2 * | 5/2002 | Miyasaka | C23C 16/0209 257/E21.101 |
| 6,410,368 | B1 * | 6/2002 | Kawasaki | H01L 27/12 257/E21.413 |
| 6,423,585 | B1 * | 7/2002 | Yamazaki | H01L 21/2022 438/166 |
| 6,426,486 | B1 * | 7/2002 | Bartok | B23K 3/04 219/405 |
| 6,541,294 | B1 * | 4/2003 | Yamazaki | H01L 21/32136 257/E21.311 |
| 6,576,926 | B1 * | 6/2003 | Yamazaki | H01L 27/3248 257/66 |
| 6,680,577 | B1 * | 1/2004 | Inukai | H01L 27/1222 315/169.3 |
| 6,690,068 | B2 * | 2/2004 | Yamazaki | H01L 29/78684 257/359 |
| 7,025,831 | B1 * | 4/2006 | Butterbaugh | C03C 15/00 118/715 |
| 7,052,943 | B2 * | 5/2006 | Yamazaki | H01L 27/12 257/E27.111 |
| 7,186,601 | B2 * | 3/2007 | Fukunaga | C23C 10/02 438/166 |
| 7,202,119 | B2 * | 4/2007 | Yamazaki | H01L 27/12 257/E21.413 |
| 7,306,982 | B2 * | 12/2007 | Yamazaki | H01L 21/2022 438/166 |
| 7,332,431 | B2 * | 2/2008 | Maekawa | H01L 21/3226 257/E21.32 |
| 7,365,410 | B2 * | 4/2008 | Demkov | H01L 21/02381 257/506 |
| 7,442,415 | B2 * | 10/2008 | Conley, Jr | C23C 16/45527 427/255.36 |
| 7,501,671 | B2 * | 3/2009 | Hamada | H01L 21/02672 257/223 |
| 7,503,975 | B2 * | 3/2009 | Yamazaki | H01L 27/1285 117/4 |
| 7,534,705 | B2 * | 5/2009 | Shimomura | H01L 21/02488 438/517 |
| 7,575,784 | B1 * | 8/2009 | Bi | C23C 16/402 427/248.1 |
| 7,790,633 | B1 * | 9/2010 | Tarafdar | H01L 21/02164 438/788 |
| 7,795,111 | B2 * | 9/2010 | Shimomura | H01L 21/76254 438/455 |
| 7,799,658 | B2 * | 9/2010 | Yamazaki | H01L 27/1214 438/458 |
| 7,888,160 | B2 * | 2/2011 | Shen | H01L 31/1804 438/72 |
| 7,924,951 | B2 * | 4/2011 | Wang | H04B 7/0854 375/341 |
| 7,940,395 | B2 * | 5/2011 | Monkowski | G01N 21/68 356/437 |
| 7,943,414 | B2 * | 5/2011 | Shimomura | H01L 21/02675 438/58 |
| 7,989,321 | B2 * | 8/2011 | Chen | H01L 21/28518 438/476 |
| 8,093,135 | B2 * | 1/2012 | Shimomura | H01L 21/76254 438/458 |
| 8,137,465 | B1 * | 3/2012 | Shrinivasan | H01L 21/67109 118/719 |
| 8,142,251 | B2 * | 3/2012 | Lee | B23K 26/0626 445/25 |
| 8,227,728 | B2 * | 7/2012 | Best | A47J 37/0688 219/411 |
| 8,323,754 | B2 * | 12/2012 | Olsen | H01L 21/31645 427/578 |
| 8,324,086 | B2 * | 12/2012 | Shimomura | B23K 26/08 438/479 |
| 8,394,703 | B2 * | 3/2013 | Ohnuma | H01L 21/76254 438/406 |
| 8,679,962 | B2 * | 3/2014 | Hou | H01L 29/6659 438/591 |
| 8,772,128 | B2 * | 7/2014 | Yamazaki | B23K 26/127 438/458 |
| 8,809,175 | B2 * | 8/2014 | Tsai | H01L 21/28185 438/591 |
| 9,093,468 | B2 * | 7/2015 | Tsai | H01L 21/02636 |
| 9,842,738 | B2 * | 12/2017 | Nakanishi | H01L 21/02529 |
| 10,074,555 | B2 * | 9/2018 | Koelmel | H01L 21/68785 |
| 2001/0047990 | A1 * | 12/2001 | Yoo | C30B 31/12 219/411 |
| 2002/0038889 | A1 * | 4/2002 | Yamazaki | H01L 29/78684 257/347 |
| 2002/0079798 | A1 * | 6/2002 | Suzuki | H01L 21/67115 313/113 |
| 2002/0164843 | A1 * | 11/2002 | Yamazaki | H01L 27/12 438/166 |
| 2003/0037730 | A1 * | 2/2003 | Yamasaki | C23C 16/45593 118/715 |
| 2003/0038128 | A1 * | 2/2003 | Suzuki | C30B 31/14 219/390 |
| 2003/0060057 | A1 * | 3/2003 | Raaijmakers | H01L 21/28167 438/770 |

(56) References Cited

U.S. PATENT DOCUMENTS

| | | | |
|---|---|---|---|
| 2003/0122129 A1* | 7/2003 | Yamazaki | H01L 29/78621 257/64 |
| 2003/0213436 A1* | 11/2003 | Kwon | H01L 21/67109 118/725 |
| 2004/0065902 A1* | 4/2004 | Yamazaki | H01L 51/5259 257/200 |
| 2005/0001173 A1* | 1/2005 | Harrison | G01N 21/55 250/372 |
| 2005/0006590 A1* | 1/2005 | Harrison | G01J 3/021 250/372 |
| 2005/0074985 A1* | 4/2005 | Yoo | H01L 21/67115 438/795 |
| 2006/0147369 A1* | 7/2006 | Bi | C01G 9/02 423/594.17 |
| 2006/0201018 A1* | 9/2006 | McKay | F26B 3/28 34/276 |
| 2006/0285108 A1* | 12/2006 | Morrisroe | F23G 5/10 356/316 |
| 2006/0286492 A1* | 12/2006 | Morrisroe | H01J 27/16 431/2 |
| 2007/0098904 A1* | 5/2007 | Aschner | F27B 17/0025 427/372.2 |
| 2007/0273860 A1* | 11/2007 | Tanaka | G03F 7/70858 355/72 |
| 2008/0169064 A1* | 7/2008 | Samukawa | H01L 21/3065 156/345.1 |
| 2009/0034948 A1* | 2/2009 | Ueshima | H01L 21/67115 392/416 |
| 2009/0075083 A1* | 3/2009 | Bi | C01B 33/182 428/402 |
| 2009/0166351 A1* | 7/2009 | Yokomori | F27D 11/12 219/492 |
| 2009/0181552 A1 | 7/2009 | Shimomura et al. | |
| 2009/0274454 A1* | 11/2009 | Aderhold | H01L 21/67115 392/416 |
| 2010/0209328 A1* | 8/2010 | Bi | B22F 1/0018 423/344 |
| 2010/0213171 A1* | 8/2010 | Koshimizu | H01J 37/32091 216/67 |
| 2011/0108195 A1* | 5/2011 | Nishimoto | H01L 21/67109 156/345.37 |
| 2011/0204036 A1* | 8/2011 | Murobayashi | H01L 21/67248 219/201 |
| 2011/0274417 A1* | 11/2011 | Camm | H01L 21/2686 392/411 |
| 2012/0067864 A1* | 3/2012 | Kusuda | H01L 21/67115 219/385 |
| 2012/0090691 A1* | 4/2012 | Baluja | H01L 21/6719 137/13 |
| 2012/0149212 A1* | 6/2012 | Strauch | C23C 16/4412 438/763 |
| 2012/0288970 A1* | 11/2012 | Hashimoto | G01J 5/0007 438/16 |
| 2013/0059092 A1* | 3/2013 | Mungekar | H01J 37/3244 427/569 |
| 2013/0171757 A1* | 7/2013 | Ponnekanti | H01L 21/67173 438/57 |
| 2013/0228775 A1* | 9/2013 | Noda | H01L 29/7869 257/43 |
| 2014/0338591 A1* | 11/2014 | Ikeda | H01L 21/67115 117/220 |
| 2015/0140838 A1 | 5/2015 | Kashefi et al. | |

FOREIGN PATENT DOCUMENTS

| | | |
|---|---|---|
| JP | 2000-182980 | 6/2000 |
| JP | 2000-182981 | 6/2000 |
| JP | 2000182980 | 6/2000 |
| JP | 2009-164380 | 7/2009 |

OTHER PUBLICATIONS

Ferrari et al., "Diffusion Reaction of Oxygen in HfO2/SiO2/Si Stacks," *The Journal of Physical Chemistry B*, vol. 110, No. 30, Jul. 12, 2006, pp. 14905-14910.

Driemeier et al., "Thermochemical behavior of hydrogen in hafnium silicate films on Si," Applied Physics Letters, vol. 89, Issue 5, Aug. 2006,—4 pages.

Driemeier et al., "Room temperature interactions of water vapor with Hf O2 films on Si," Applied Physics Letters, vol. 88, Issue 20, May 2006—3 pages.

Conley, Jr. et al., "Densification and improved electrical properties of pulse-deposited films via in situ modulated temperature annealing," *Applied Physics Letters*, vol. 84, Issue 11, Mar. 15, 2004, pp. 1913-1915.

Nakajima et al., "Experimental Demonstration of Higher-k phase HfO2 through Non-equilibrium Thermal Treatment," ECS Transactions 28.2 (2010), pp. 203-212.

Wu et al., "Device Performance and Reliability Improvement for MOSFETs With HfO2 Gate Dielectrics Fabricated Using Multideposition Room-Temperature Multiannealing," IEEE Electron Device Letters, vol. 32, Issue 9, Sep. 2011, pp. 1173-1175.

PCT International Search Report for corresponding PCT Application No. PCT/US2016/068028, dated Apr. 17, 2017, 3 pages.

PCT International Preliminary Report on Patentability for corresponding PCT Application No. PCT/US2016/068028, dated Jul. 3, 2018—10 pages.

\* cited by examiner

GAS FLOW CONTROL FOR MILLISECOND ANNEAL SYSTEM

PRIORITY CLAIM

The present application claims the benefit of priority of U.S. Provisional Patent Application Ser. No.: 62/272,804, filed Dec. 30, 2015, entitled "Gas Flow Control for Millisecond Anneal System," which is incorporated herein by reference.

FIELD

The present disclosure relates generally to thermal processing chambers and more particularly to millisecond anneal thermal processing chambers used for processing substrates, such as semiconductor substrates.

BACKGROUND

Millisecond anneal systems can be used for semiconductor processing for the ultra-fast heat treatment of substrates, such as silicon wafers. In semiconductor processing, fast heat treatment can be used as an anneal step to repair implant damage, improve the quality of deposited layers, improve the quality of layer interfaces, to activate dopants, and to achieve other purposes, while at the same time controlling the diffusion of dopant species.

Millisecond, or ultra-fast, temperature treatment of semiconductor substrates can be achieved using an intense and brief exposure of light to heat the entire top surface of the substrate at rates that can exceed $10^{4\circ}$ C. per second. The rapid heating of just one surface of the substrate can produce a large temperature gradient through the thickness of the substrate, while the bulk of the substrate maintains the temperature before the light exposure. The bulk of the substrate therefore acts as a heat sink resulting in fast cooling rates of the top surface.

SUMMARY

Aspects and advantages of embodiments of the present disclosure will be set forth in part in the following description, or may be learned from the description, or may be learned through practice of the embodiments.

One example aspect of the present disclosure is directed to a thermal processing system. The thermal processing system includes a top chamber separated from a bottom chamber by a wafer plane plate. The system includes a plurality of heat sources configured to provide heat for the thermal treatment of a substrate. The system includes a plurality of gas inlets configured to inject gas into the processing chamber. One or more of the direction, size, position shape, or arrangement of the gas inlets are configured to increase laminar flow across the wafer plane plate.

Another example aspect of the present disclosure is directed to a millisecond anneal system. The millisecond anneal system includes a processing chamber having a top chamber separated from a bottom chamber by a wafer plane plate. The system includes one or more arc lamps configured to provide a flash for the thermal treatment of a substrate. The system includes one or more gas inlets configured to inject gas into the processing chamber. The wafer plane plate has at least one gas channel. A length of the gas channel is equal to about a width of the processing chamber.

Another example aspect of the present disclosure is directed to a millisecond anneal system. The millisecond anneal system includes a processing chamber having a top chamber separated from a bottom chamber by a wafer plane plate. The system includes one or more arc lamps configured to provide a flash for the thermal treatment of a substrate. The system includes one or more gas inlets configured to inject gas into the processing chamber. The system can include a liner plate disposed in parallel relationship above the wafer plane plate.

Other example aspects of the present disclosure are directed to systems, methods, devices, and processes for thermally treating a substrate.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
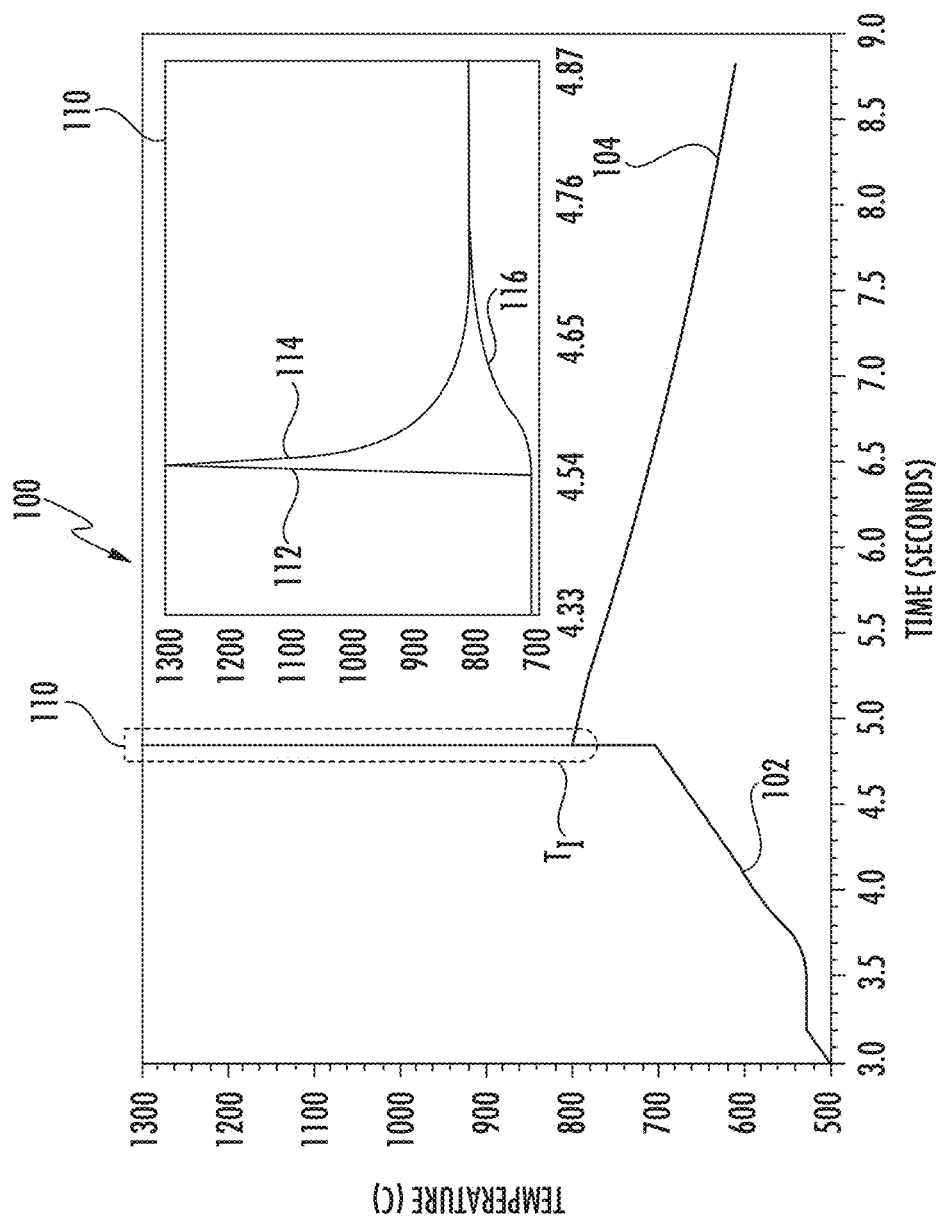
FIG. 1 depicts an example millisecond anneal heating profile according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Overview

Example aspects of the present disclosure are directed to gas flow improvement in a millisecond anneal system. Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any workpiece, semiconductor substrate or other suitable substrate. The use of the term "about" in conjunction with a numerical value is intended to refer to within 10% of the stated numerical value.

The thermal treatment of semiconductor substrates in a millisecond anneal processing chamber can be carried out in a controlled gas ambient at atmospheric pressure. The main gas can be Nitrogen ($N_2$), but other gases (e.g., Ar, $O_2$, $NH_3$ or other gases) are also compatible with the chamber. During substrate exchange, the process chamber can be opened to the surrounding air of the wafer handling module. For this reason, the chamber has to be purged prior to the start of the heat treatment.

In many instances, the gas flow pattern in a millisecond anneal system can have an impact on the heat transfer of the semiconductor substrate and therefore also on the temperature uniformity across the semiconductor substrate. Locally, gas flow influences the cooling rate at a particular region of the semiconductor substrate by forced convection. A uniform, laminar flow pattern across and around the semiconductor substrate can have a reduced impact on wafer temperature uniformity.

In addition, the gas flow pattern can have impact on how particles are moving through the chamber and how they are re-distributed. Typical particle sources are the wafer handling mechanisms (e.g., a wafer lift mechanism and robot end effector for moving placing the semiconductor substrates). Hot semiconductor substrates can repel particles due to the thermophoresis effect. However, turbulent flow and stagnant flow regions can lead to re-distribution and accumulation of particles such that they are deposited onto the semiconductor wafer.

Moreover, the gas flow pattern can influence how gaseous contaminants from the wafer are moving through the chamber. These contaminants are usually released during the heat treatment of the wafer and stem from surface layers or are a result of other processing steps prior to the heat treatment step. In embodiments where the millisecond anneal system is a cold wall system (e.g., includes fluid cooled reflective mirrors), these contaminates can be deposited on the reflective mirrors, reducing the reflectivity and hence have an adverse effect on the wafer temperature uniformity According to example aspects of the present disclosure, a gas flow pattern inside the process chamber of a millisecond anneal system can be improved by implementing one or more of the following: (1) altering the direction, size, position, shape and arrangement of the gas injection inlet nozzles, or a combination hereof; (2) changing the dimensions of gas channels in a wafer plane plate connecting the upper chamber with the lower chamber of a millisecond anneal system; and/or (3) decreasing the effective volume of the processing chamber using a liner plate disposed above the semiconductor substrate.

For example, in some embodiments, a thermal processing system can include a processing chamber having a top chamber separated from a bottom chamber by a wafer plane plate. The system can include a plurality of heat sources configured to provide heat for the thermal treatment of a substrate. The system can include a plurality of gas inlets configured to inject gas into the processing chamber. One or more of the direction, size, position, shape, or arrangement of the gas inlets are arranged relative to the wafer plane plate to increase laminar flow across the wafer plane plate.

In some embodiments, the plurality of gas inlets can be arranged in separate top corners of the top chamber. The gas inlets can be oriented to point to the substrate. In some embodiments, at least one of the plurality of gas inlets is positioned proximate to the wafer plane plate. For instance, at least one of the plurality of gas inlets can be positioned a first distance from a ceiling of the top chamber and a second distance from the wafer plane plate. The first distance is greater than the second distance. In these embodiments, the system can in some examples, additionally include a plurality of gas inlets located in separate top corners of the top chamber.

In some embodiments, at least one of the plurality of gas inlets is positioned opposite a gate valve proximate the wafer plane plate. The gas flow system can further include one or more vents positioned proximate to the gate valve.

In some embodiments, one or more of the plurality of gas inlets includes a pipe penetrating into the processing chamber through a reflective mirror. In some embodiments, the pipe can have a straight open end. In some embodiments, the pipe can have an opening perpendicular to a pipe axis. In some embodiments, the pipe can have an opening that is at a non-perpendicular angle with respect to a pipe axis.

Another example embodiment of the present disclosure is directed to a millisecond anneal system. The millisecond anneal system includes a processing chamber having a top chamber separated from a bottom chamber by a wafer plane plate. The system includes one or more arc lamps configured to provide a flash for the thermal treatment of a substrate. The system includes one or more gas inlets configured to inject gas into the processing chamber. The wafer plane plate has at least one gas channel. A length of the gas channel is equal to about a width of the processing chamber.

In some embodiments, the wafer plane plate includes a plurality of gas channels disposed on separate sides of the wafer plane plate. For instance, in some embodiments, the wafer plane plate includes a first set of gas channels disposed on opposing sides of the wafer plane plate and a second set of gas channels disposed on different opposing sides of the wafer plane plate. The first set of gas channels each have a first length and the second set of gas channels each have a second length. The first length can be greater than the second length. For instance, the first length can be equal to about a width of the processing chamber and the second length can be less than the width of the processing chamber.

Another example embodiment of the present disclosure is directed to a millisecond anneal system. The millisecond anneal system includes a processing chamber having a top chamber separated from a bottom chamber by a wafer plane plate. The system includes one or more arc lamps configured to provide a flash for the thermal treatment of a substrate. The system includes one or more gas inlets configured to inject gas into the processing chamber. The system can include a liner plate disposed in parallel relationship above the wafer plane plate.

In some embodiments, the liner plate can be quartz. In some embodiments, a distance between the wafer plane plate and the liner is in the range of about 30 mm to about 60 mm.

Example Millisecond Anneal Systems

An example millisecond anneal system can be configured to provide an intense and brief exposure of light to heat the top surface of a wafer at rates that can exceed, for instance, about $10^{4\circ}$ C./s. FIG. 1 depicts an example temperature profile 100 of a semiconductor substrate achieved using a millisecond anneal system. As shown in FIG. 1, the bulk of the semiconductor substrate (e.g., a silicon wafer) is heated to an intermediate temperature $T_i$ during a ramp phase 102. The intermediate temperature can be in the range of about 450° C. to about 900° C. When the intermediate temperature $T_i$ is reached, the top side of the semiconductor substrate can be exposed to a very short, intense flash of light resulting in heating rates of up to about $10^{4\circ}$ C./s. Window 110 illustrates the temperature profile of the semiconductor substrate during the short, intense flash of light. Curve 112 represents the rapid heating of the top surface of the semiconductor substrate during the flash exposure. Curve 116 depicts the temperature of the remainder or bulk of the semiconductor substrate during the flash exposure. Curve 114 represents the rapid cool down by conductive of cooling of the top surface of the semiconductor substrate by the bulk of the semiconductor substrate acting as a heat sink. The bulk of the semiconductor substrate acts as a heat sink generating high top side cooling rates for the substrate. Curve 104 represents the slow cool down of the bulk of the semiconductor substrate by thermal radiation and convection, with a process gas as a cooling agent. As used herein, the term "about" when used in reference to a numerical value refers to within 30% of the stated numerical value.

An example millisecond anneal system can include a plurality of arc lamps (e.g., four Argon arc lamps) as light sources for intense millisecond long exposure of the top surface of the semiconductor substrate—the so called "flash." The flash can be applied to the semiconductor substrate when the substrate has been heated to an intermediate temperature (e.g., about 450° C. to about 900° C.). A plurality of continuous mode arc lamps (e.g., two Argon arc lamps) can be used to heat the semiconductor substrate to the intermediate temperature. In some embodiments, the heating of the semiconductor substrate to the intermediate temperature is accomplished through the bottom surface of the semiconductor substrate at a ramp rate which heats the entire bulk of the wafer.

Figure 2:
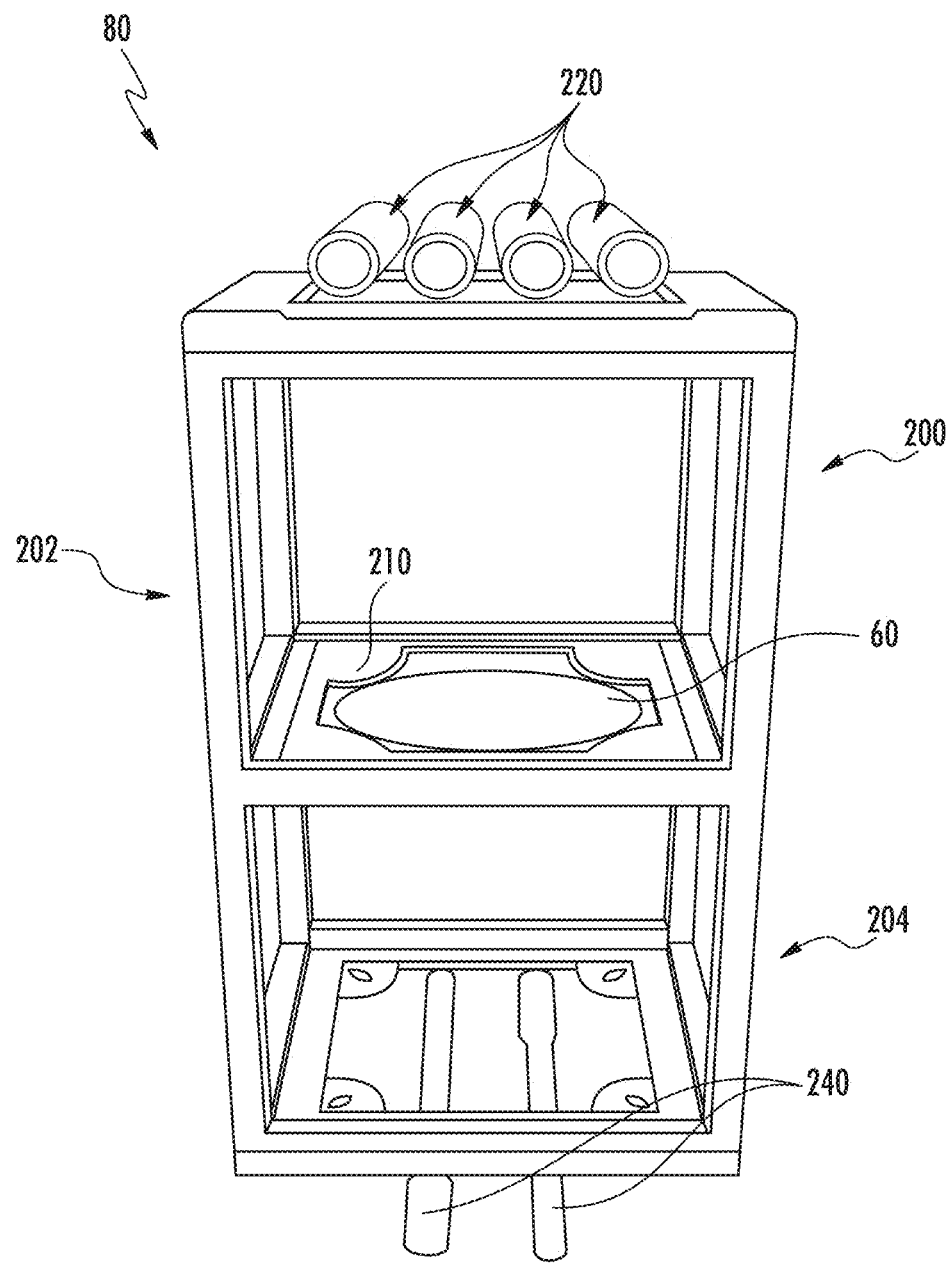
FIG. 2 depicts an example perspective view of a portion of an example millisecond anneal system according to example embodiments of the present disclosure.
Figure 3:
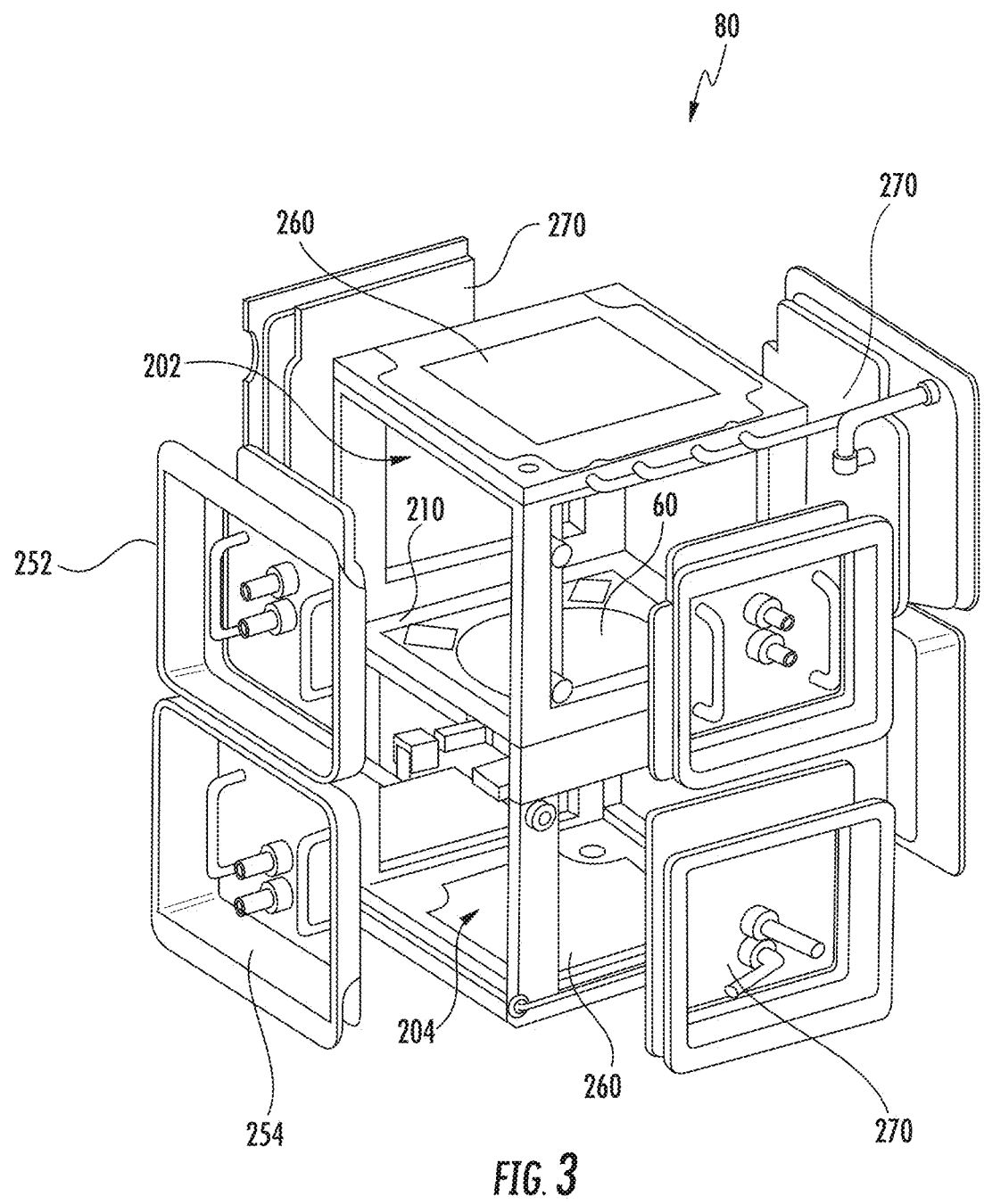
FIG. 3 depicts an exploded view of an example millisecond anneal system according to example embodiments of the present disclosure.
Figure 4:
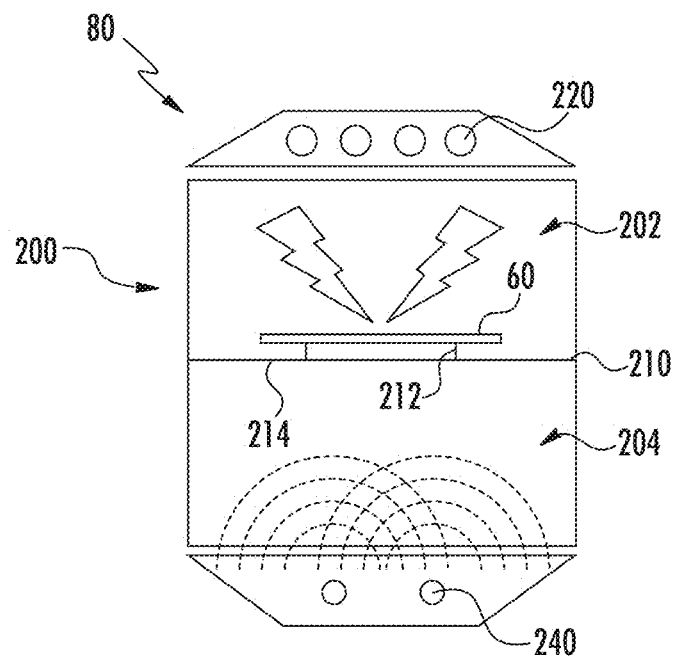
FIG. 4 depicts a cross-sectional view of an example millisecond anneal system according to example embodiments of the present disclosure.

FIGS. 2 to 5 depict various aspects of an example millisecond anneal system 80 according to example embodiments of the present disclosure. As shown in FIGS. 2-4, a millisecond anneal system 80 can include a process chamber 200. The process chamber 200 can be divided by a wafer plane plate 210 into a top chamber 202 and a bottom chamber 204. A semiconductor substrate 60 (e.g., a silicon wafer) can be supported by support pins 212 (e.g., quartz support pins) mounted to a wafer support plate 214 (e.g., quartz glass plate inserted into the wafer plane plate 210).

As shown in FIGS. 2 and 4, the millisecond anneal system 80 can include a plurality of arc lamps 220 (e.g., four Argon arc lamps) arranged proximate the top chamber 202 as light sources for intense millisecond long exposure of the top surface of the semiconductor substrate 60—the so called "flash." The flash can be applied to the semiconductor substrate when the substrate has been heated to an intermediate temperature (e.g., about 450° C. to about 900° C.).

A plurality of continuous mode arc lamps 240 (e.g., two Argon arc lamps) located proximate the bottom chamber 204 can be used to heat the semiconductor substrate 60 to the intermediate temperature. In some embodiments, the heating of the semiconductor substrate 60 to the intermediate temperature is accomplished from the bottom chamber 204 through the bottom surface of the semiconductor substrate at a ramp rate which heats the entire bulk of the semiconductor substrate 60.

As shown in FIG. 3, the light to heat the substrate 60 from the bottom arc lamps 240 (e.g., for use in heating the semiconductor substrate to an intermediate temperature) and from the top arc lamps 220 (e.g., for use in providing millisecond heating by flash) can enter the processing chamber 200 through water windows 260 (e.g., water cooled quartz glass windows). In some embodiments, the water windows 260 can include a sandwich of two quartz glass panes between which an about a 4 mm thick layer of water is circulating to cool the quartz panes and to provide an optical filter for wavelengths, for instance, above about 1400 nm.

Figure 5:
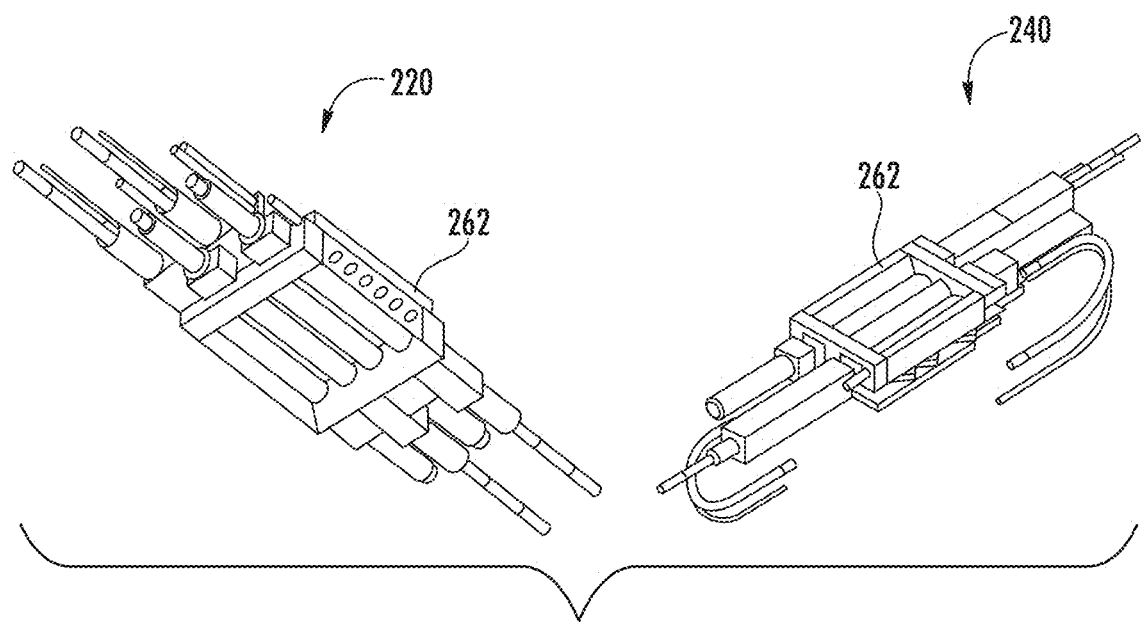
FIG. 5 depicts a perspective view of example lamps used in a millisecond anneal system according to example embodiments of the present disclosure.

As further illustrated in FIG. 3, process chamber walls 250 can include reflective mirrors 270 for reflecting the heating light. The reflective mirrors 270 can be, for instance, water cooled, polished aluminum panels. In some embodiments, the main body of the arc lamps used in the millisecond anneal system can include reflectors for lamp radiation. For instance, FIG. 5 depicts a perspective view of both a top lamp array 220 and a bottom lamp array 240 that can be used in the millisecond anneal system 200. As shown, the main body of each lamp array 220 and 240 can include a reflector 262 for reflecting the heating light. These reflectors 262 can form a part of the reflecting surfaces of the process chamber 200 of the millisecond anneal system 80.

The temperature uniformity of the semiconductor substrate can be controlled by manipulating the light density falling onto different regions of the semiconductor substrate. In some embodiments, uniformity tuning can be accomplished by altering the reflection grade of small size reflectors to the main reflectors and/or by use of edge reflectors mounted on the wafer support plane surrounding the wafer.

Figure 6:
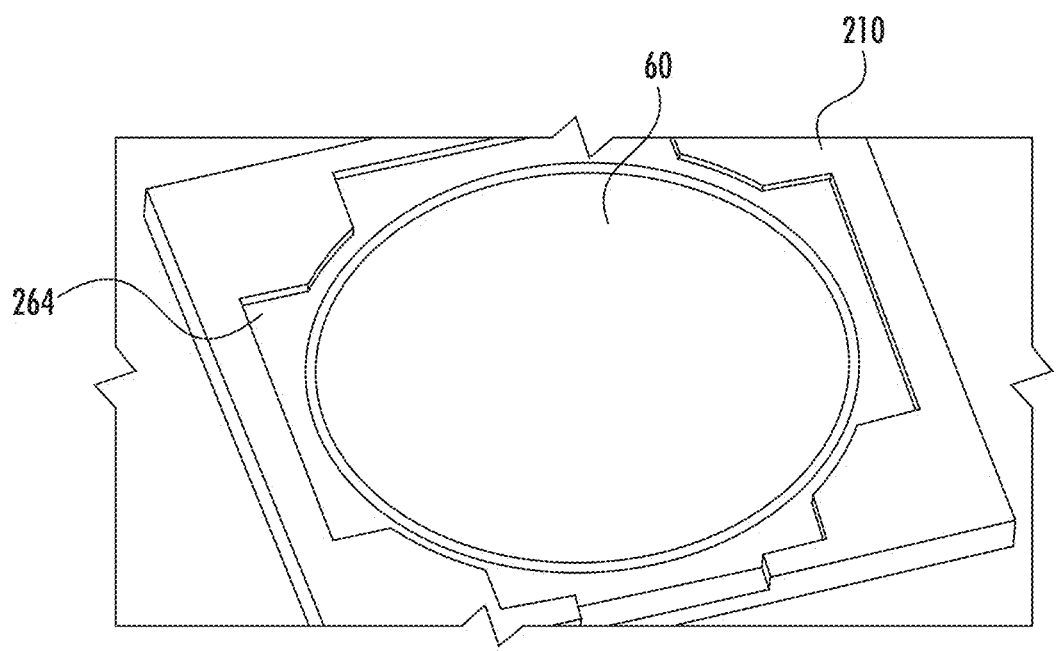
FIG. 6 depicts example edge reflectors used in a wafer plane plate of a millisecond anneal system according to example embodiments of the present disclosure.

For instance, edge reflectors can be used to redirect light from the bottom lamps 240 to an edge of the semiconductor substrate 60. As an example, FIG. 6 depicts example edge reflectors 264 that form a part of the wafer plane plate 210 that can be used to direct light from the bottom lamps 240 to the edge of the semiconductor substrate 60. The edge reflectors 264 can be mounted to the wafer plane plate 210 and can surround or at least partially surround the semiconductor substrate 60.

Figure 7:
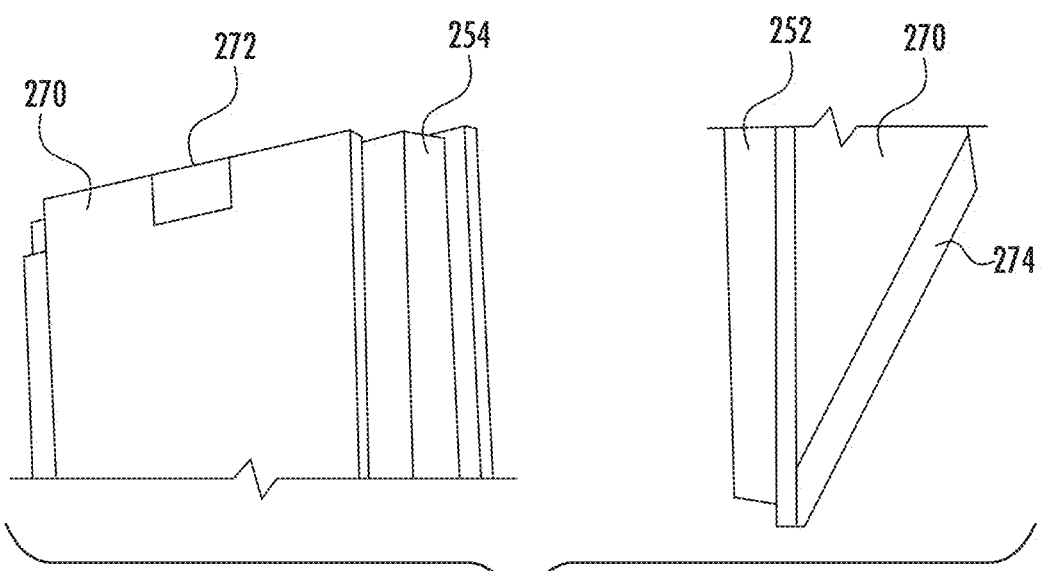
FIG. 7 depicts example reflectors that can be used in a millisecond anneal system according to example embodiments of the present disclosure.

In some embodiments, additional reflectors can also be mounted on chamber walls near the wafer plane plate 210. For example, FIG. 7 depicts example reflectors that can be mounted to the process chamber walls that can act as reflector mirrors for the heating light. More particularly, FIG. 7 shows an example wedge reflector 272 mounted to lower chamber wall 254. FIG. 7 also illustrates a reflective element 274 mounted to reflector 270 of an upper chamber wall 252. Uniformity of processing of the semiconductor substrate 60 can be tuned by changing the reflection grade of the wedge reflectors 272 and/or other reflective elements (e.g., reflective element 274) in the processing chamber 200.

Figure 8:
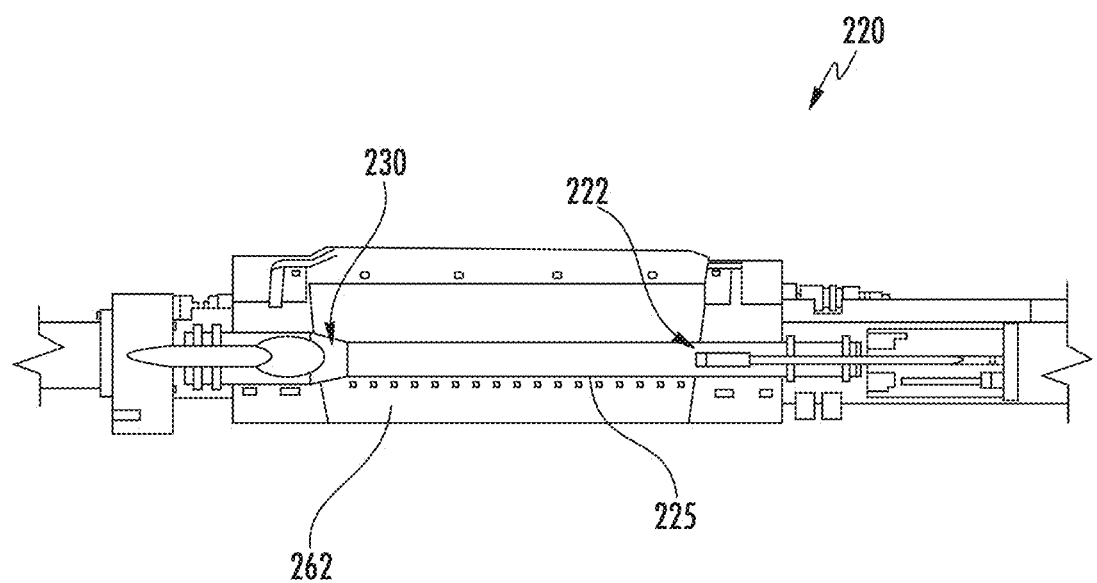
FIG. 8 depicts an example arc lamp that can be used in a millisecond anneal system according to example embodiments of the present disclosure.
Figure 9:
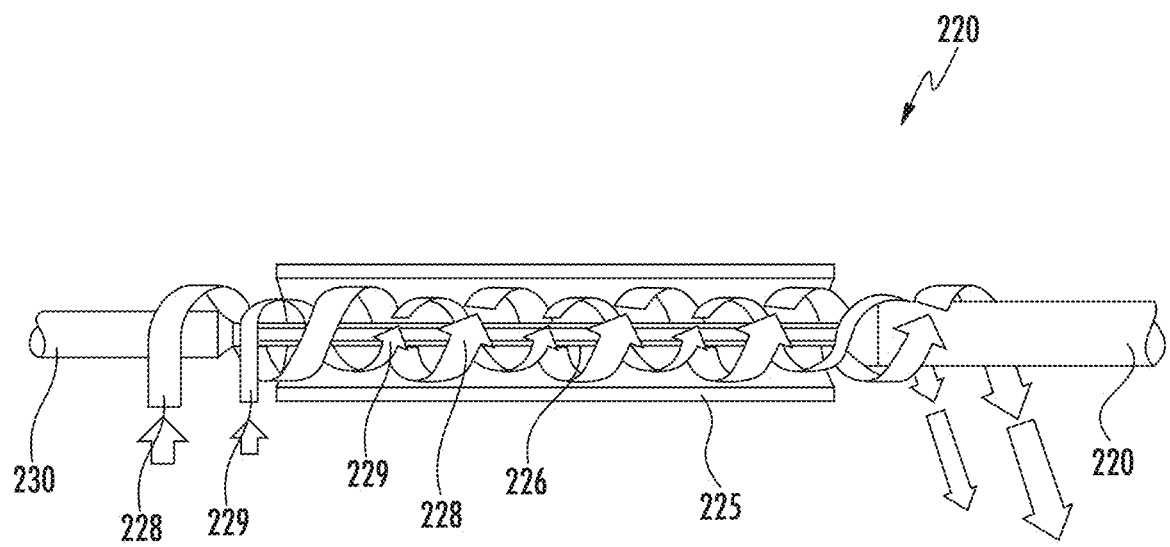
FIGS. 9-10 depict the operation of an example arc lamp according to example embodiments of the present disclosure.

FIGS. 8-11 depict aspects of example upper arc lamps 220 that can be used as light sources for intense millisecond long exposure of the top surface of the semiconductor substrate 60 (e.g., the "flash"). For instance, FIG. 8 depicts a cross-sectional view of an example arc lamp 220. The arc lamp 220 can be, for instance, an open flow arc lamp, where pressurized Argon gas (or other suitable gas) is converted into a high pressure plasma during an arc discharge. The arc discharge takes place in a quartz tube 225 between a negatively charged cathode 222 and a spaced apart positively charged anode 230 (e.g., spaced about 300 mm apart). As soon as the voltage between the cathode 222 and the anode 230 reaches a breakdown voltage of Argon (e.g., about 30 kV) or other suitable gas, a stable, low inductive plasma is formed which emits light in the visible and UV range of the electromagnetic spectrum. As shown in FIG. 9, the lamp can include a lamp reflector 262 that can be used to reflect light provided by the lamp for processing of the semiconductor substrate 60.

Figure 10:
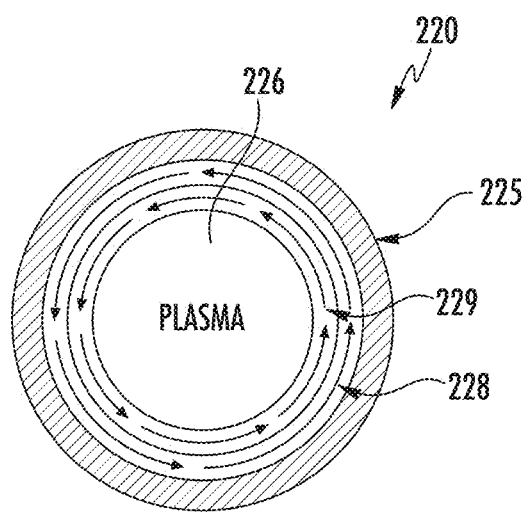
Figure 11:
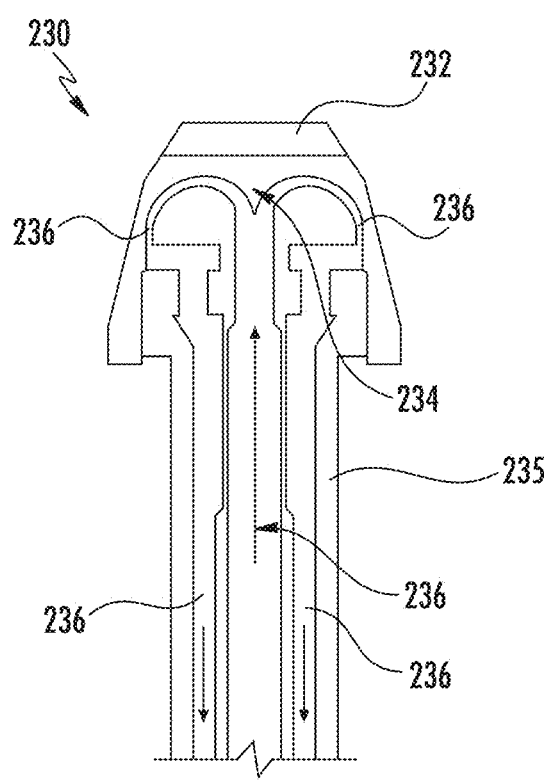
FIG. 11 depicts a cross-sectional view of an example electrode according to example embodiments of the present disclosure.

FIGS. 10 and 11 depict aspects of example operation of an arc lamp 220 in millisecond anneal system 80 according to example embodiments of the present disclosure. More particularly, a plasma 226 is contained within a quartz tube 225 which is water cooled from the inside by a water wall 228. The water wall 228 is injected at high flow rates on the cathode end of the lamp 200 and exhausted at the anode end. The same is true for the Argon gas 229, which is also entering the lamp 220 at the cathode end and exhausted from the anode end. The water forming the water wall 228 is injected perpendicular to the lamp axis such that the centrifugal action generates a water vortex. Hence, along the center line of the lamp a channel is formed for the Argon gas 229. The Argon gas column 229 is rotating in the same direction as the water wall 228. Once a plasma 226 has formed, the water wall 228 is protecting the quartz tube 225 and confining the plasma 226 to the center axis. Only the water wall 228 and the electrodes (cathode 230 and anode 222) are in direct contact with the high energy plasma 226.

FIG. 11 depicts a cross sectional view of an example electrode (e.g., cathode 230) used in conjunction with an arc lamp according to example embodiments of the present disclosure. FIG. 11 depicts a cathode 230. However, a similar construction can be used for the anode 222.

In some embodiments, as the electrodes experience a high heat load, one or more of the electrodes can each include a tip 232. The tip can be made from tungsten. The tip can be coupled to and/or fused to a water cooled copper heat sink 234. The copper heat sink 234 can include at least a portion the internal cooling system of the electrodes (e.g., one or more water cooling channels 236. The electrodes can further include a brass base 235 with water cooling channels 236 to provide for the circulation of water or other fluid and the cooling of the electrodes.

The arc lamps used in example millisecond anneal systems according to aspects of the present disclosure can be an open flow system for water and Argon gas. However, for conservation reasons, both media can be circulated in a close loop system in some embodiments.

Figure 12:
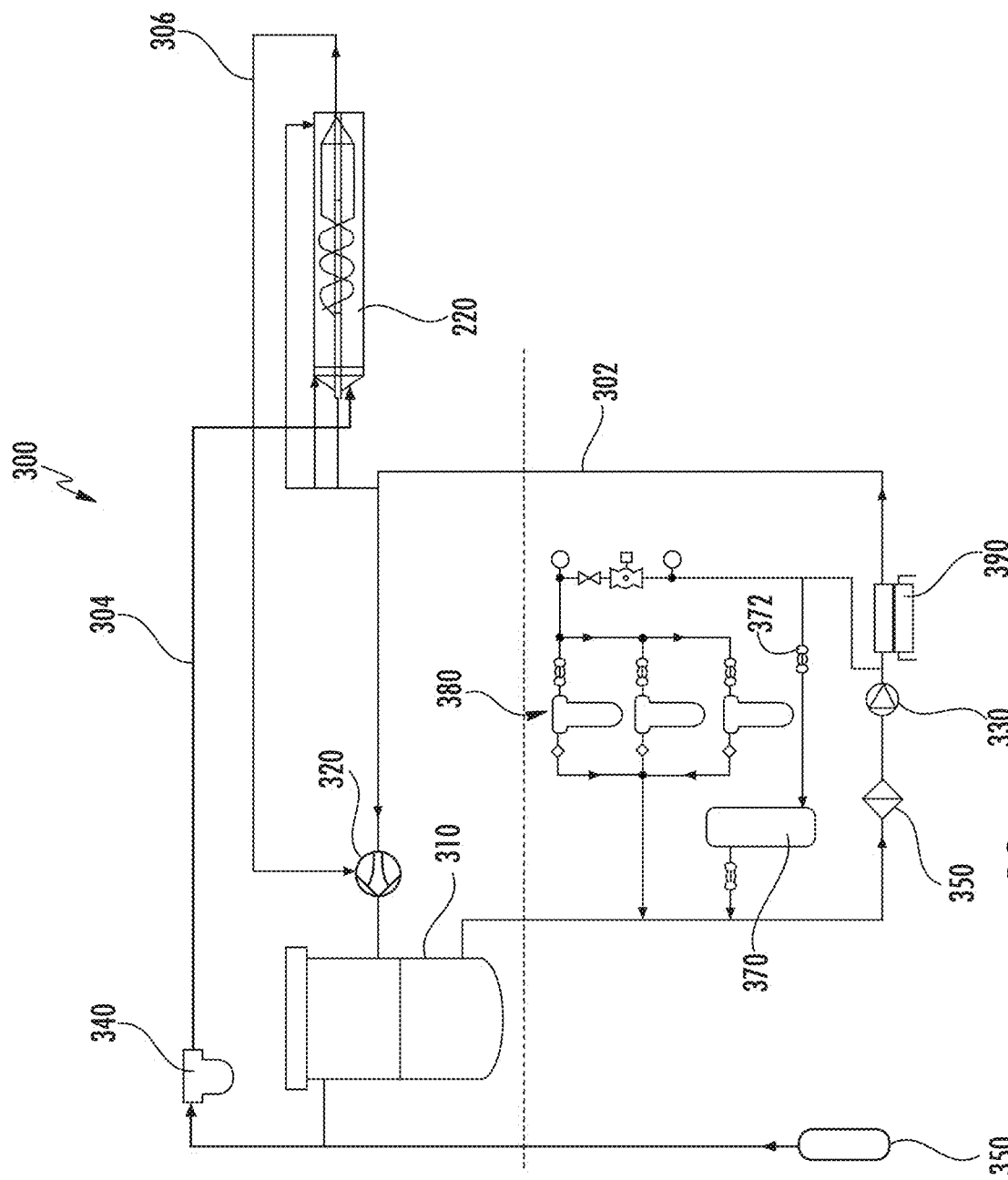
FIG. 12 depicts an example closed loop system for supplying water and gas (e.g., Argon gas) to example arc lamps used in a millisecond anneal system according to example embodiments of the present disclosure.

FIG. 12 depicts an example closed loop system 300 for supplying water and Argon gas needed to operate the open flow Argon arc lamps used in millisecond anneal systems according to example embodiments of the present disclosure.

More particularly, high purity water 302 and Argon 304 is fed to the lamp 220. The high purity water 302 is used for the water wall and the cooling of the electrodes. Leaving the lamp is a gas/water mixture 306. This water/gas mixture 306 is separated into gas free water 302 and dry Argon 304 by separator 310 before it can be re-fed to the inlets of the lamp 220. To generate the required pressure drop across the lamp 220, the gas/water mixture 306 is pumped by means of a water driven jet pump 320.

A high power electric pump 330 supplies the water pressure to drive the water wall in the lamp 220, the cooling water for the lamp electrodes, and the motive flow for the jet pump 320. The separator 310 downstream to the jet pump 320 can be used extracting the liquid and the gaseous phase from the mixture (Argon). Argon is further dried in a coalescing filter 340 before it re-enters the lamp 220. Additional Argon can be supplied from Argon source 350 if needed.

The water is passing through one or more particle filters 350 to remove particles sputtered into the water by the arc. Ionic contaminations are removed by ion exchange resins. A portion of water is run through mixed bed ion exchange filters 370. The inlet valve 372 to the ion exchange bypass 370 can be controlled by the water resistivity. If the water resistivity drops below a lower value the valve 372 is opened, when it reaches an upper value the valve 372 is closed. The system can contain an activated carbon filter bypass loop 380 where a portion of the water can be additionally filtered to remove organic contaminations. To maintain the water temperature, the water can pass through a heat exchanger 390.

Figure 13:
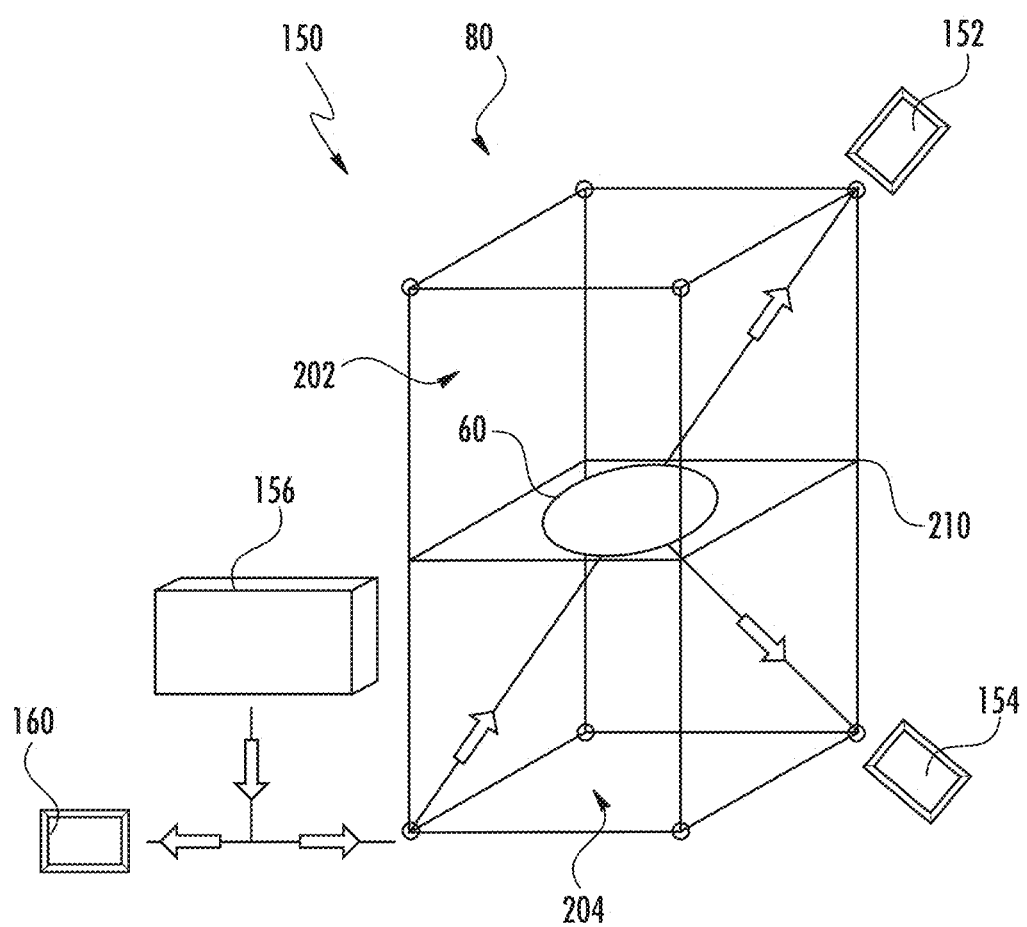
FIG. 13 depicts an example temperature measurement system for a millisecond anneal system according to example embodiments of the present disclosure.

Millisecond anneal systems according to example embodiments of the present disclosure can include the ability to independently measure temperature of both surfaces (e.g., the top and bottom surfaces) of the semiconductor substrate. FIG. 13 depicts an example temperature measurement system 150 for millisecond anneal system 200.

A simplified representation of the millisecond anneal system 200 is shown in FIG. 13. The temperature of both sides of a semiconductor substrate 60 can be measured independently by temperature sensors, such as temperature sensor 152 and temperature sensor 154. Temperature sensor 152 can measure a temperature of a top surface of the semiconductor substrate 60. Temperature sensor 154 can measure a bottom surface of the semiconductor substrate 60. In some embodiments, narrow band pyrometric sensors with a measurement wavelength of about 1400 nm can be used as temperature sensors 152 and/or 154 to measure the temperature of, for instance, a center region of the semiconductor substrate 60. In some embodiments, the temperature sensors 152 and 154 can be ultra-fast radiometers (UFR) that have a sampling rate that is high enough to resolve the millisecond temperature spike cause by the flash heating.

The readings of the temperature sensors 152 and 154 can be emissivity compensated. As shown in FIG. 13, the emissivity compensation scheme can include a diagnostic flash 156, a reference temperature sensor 158, and the temperature sensors 152 and 154 configured to measure the top and bottom surface of the semiconductor wafers. Diagnostic heating and measurements can be used with the diagnostic flash 156 (e.g., a test flash). Measurements from reference temperature sensor 158 can be used for emissivity compensation of temperature sensors 152 and 154

In some embodiments, the millisecond anneal system 200 can include water windows. The water windows can provide an optical filter that suppresses lamp radiation in the measurement band of the temperature sensors 152 and 154 so that the temperature sensors 152 and 154 only measure radiation from the semiconductor substrate.

The readings of the temperature sensors 152 and 154 can be provided to a processor circuit 160. The processor circuit 160 can be located within a housing of the millisecond anneal system 200, although alternatively, the processor circuit 160 may be located remotely from the millisecond anneal system 200. The various functions described herein may be performed by a single processor circuit if desired, or by other combinations of local and/or remote processor circuits.

The readings of the temperature sensors 152 and 154 can be used by the processor circuit 160 to determine a temperature profile across the substrate. The temperature profile can provide a measure of the temperature of the substrate at various locations across the surface of the substrate. The temperature profile can provide a measure of thermal uniformity of the substrate during processing.

Example Gas Flow System for Millisecond Anneal Systems

Figure 14:
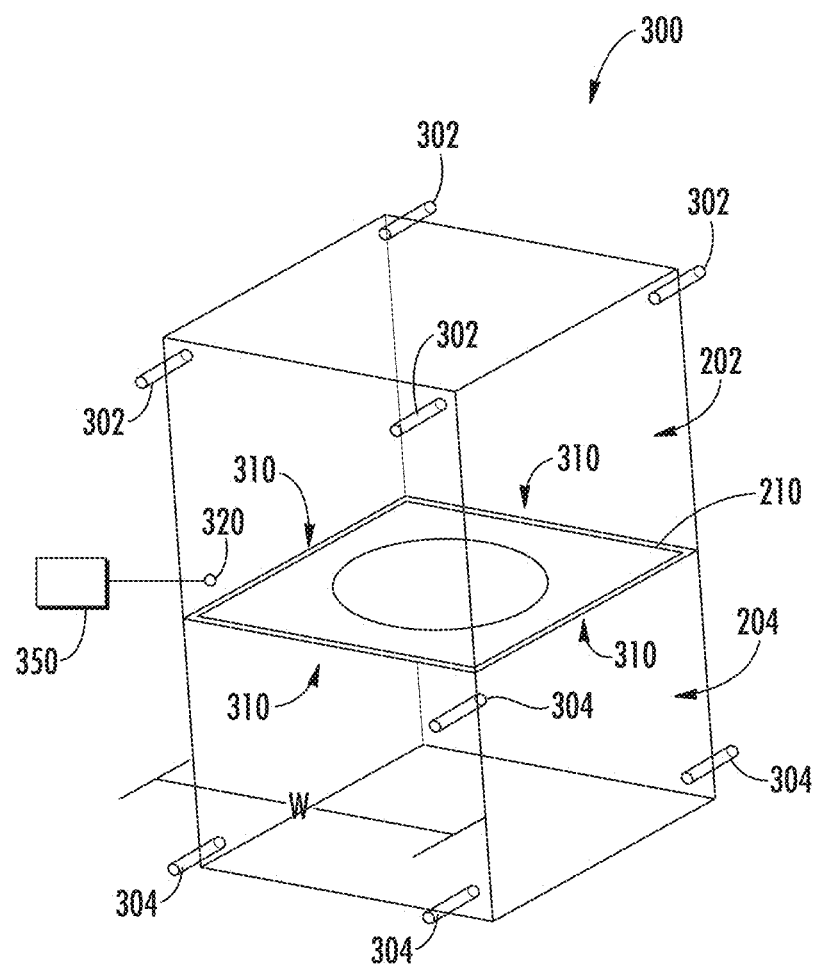
FIG. 14 depicts a gas flow system for a millisecond anneal system according to example embodiments of the present disclosure.

FIG. 14 depicts an example gas flow system for a millisecond anneal system according to example embodiments of the present disclosure. The thermal treatment of semiconductor substrates in a millisecond anneal processing chamber can be carried out in a controlled gas ambient at atmospheric pressure. The main gas can be Nitrogen ($N_2$), but other gases (e.g., Ar, $O_2$, $NH_3$ or other gases) are also compatible with the chamber. During substrate exchange, the process chamber can be opened to the surrounding air of the wafer handling module. For this reason, the chamber has to be purged prior to the start of the heat treatment.

FIG. 14 depicts a simplified representation of a gas flow system 300 according to example embodiments of the present disclosure. The gas flow system 300 can include gas inlets 302 located in the four top corners of the top chamber 202 of the millisecond anneal system. Gas can be injected in the gas inlets 302. The gas flow system 300 can include gas outlets 304 located in the bottom four corners of the bottom chamber 204. Gas outlets 304 can be used for purging the gas from the processing chamber. A wafer plane plate 210 can divide the processing chamber into the top chamber 202 and the bottom chamber 204. Gas can flow from the top chamber 202 to the bottom chamber 204 through gas channels 310 defined in the wafer plane plate 210.

Purging can be accomplished by flowing high purity process nitrogen gas at high rates (100 l/min) through the chamber. The remaining contamination level can be measured by an $O_2$-sensor 320. The $O_2$ sensor 320 can send signals to one or more control devices 350 indicative of the $O_2$ level in the processing chamber. The control devices 350 can be any suitable control device, such as a controller, microcontroller, application specific integrated circuit, processor configured to execute computer-readable instructions, etc. The end of the purge step can be reached when the desired $O_2$ level (e.g., 20 ppm) is reached. At this time, the control devices 350 can reduce the flow rate of $N_2$ The $O_2$ sensor 320 can be located at the wafer plane plate 210 level of the processing chamber as shown in FIG. 14.

Example Gas Flow Pattern Improvement by Altering Gas Injection

According to example embodiments of the present disclosure, the gas flow pattern inside a processing chamber of a millisecond anneal system can be improved by altering one or more of the direction, size, position, shape, and/or arrangement (or combination thereof) of inlet nozzles associated with gas inlets used to inject gas into the processing chamber.

Figure 15:
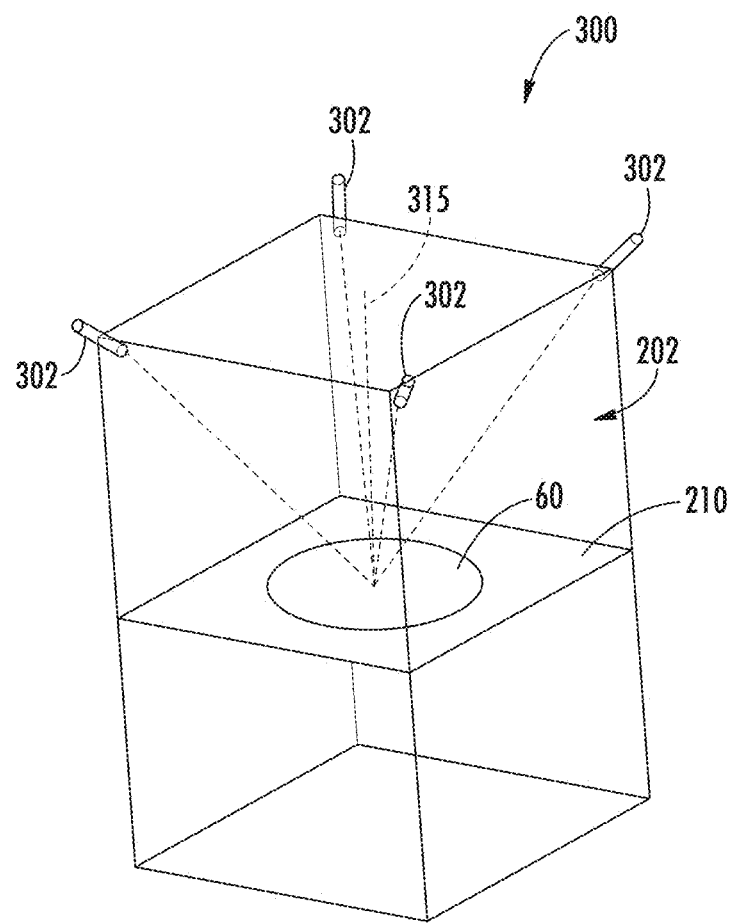
FIG. 15 depicts a gas flow system for a millisecond anneal system according to example embodiments of the present disclosure.

In some embodiments, the angle at which the gas inlets are oriented is modified. By changing the angle of orientation, the gas flow distribution in the center of the chamber can be influenced. FIG. 15 depicts one example embodiment of a gas flow system 300 according to example embodiments of the present disclosure. In the example of FIG. 15, the injection nozzles associated with all four gas inlets 302 located in the top corners of the top chamber 202 can be oriented to point to a vertical center line 315 of the chamber and can be pointing downward to the semiconductor substrate 60. In this example embodiment, the amount of gas flowing in the center of the chamber can be increased relative to the edge and corner regions of the chamber.

In some embodiments, the diameter of the gas inlet nozzles are modified. This can be performed to adjust the outlet velocity of the gas jet from an inlet nozzle. A smaller diameter can increase the velocity and can extend the reach of the gas jet. In addition, a smaller diameter can lead to more turbulent gas flow at high volumetric flow, which can be beneficial for purging and dilution of impurity gases. A larger diameter, at the same volumetric flow, can slow down the gas jet. This can help in keeping a laminar flow regime around the semiconductor substrate during heat treatment. This can benefit temperature uniformity. In some embodiments, the shape of the gas inlets can be modified to be rectangular or elliptical, rather than circular. In some embodiments, the number of inlets can be increased to provide a comb-like gas inlet arrangement.

Figure 16:
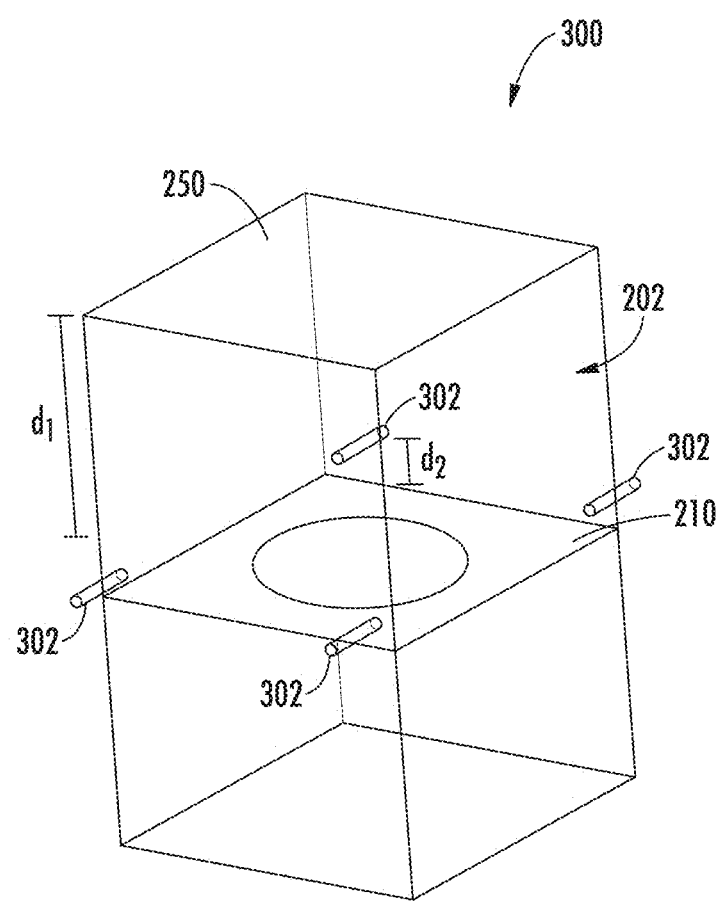
FIG. 16 depicts a gas flow system for a millisecond anneal system according to example embodiments of the present disclosure.

In some embodiments, one or more gas inlets (e.g., additional gas inlets) are positioned at a level at or proximate to the wafer plane plate. For instance, as shown in FIG. 16, the gas flow system can include gas inlets 302 located proximate to the wafer plane plate 210. More particularly, the gas inlets 302 are positioned a distance d1 from a wafer window 260 forming a ceiling of the top chamber 202 and a distance d2 from the wafer plane plate. The distance d1 is greater than d2, such as at least five times greater than d2. In some embodiments, the gas inlets 302 depicted in FIG. 16 can be in addition to gas inlets located in top corners of the top chamber 202. This can give direct control over the ambient gas conditions at a location where it matters most.

Figure 17:
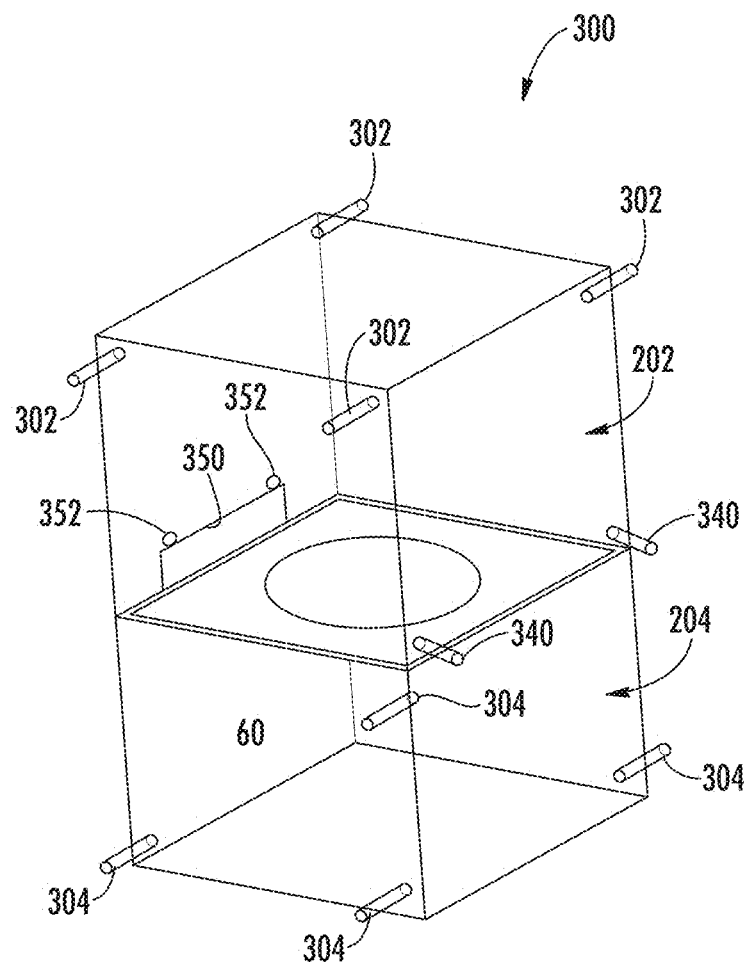
FIG. 17 depicts a gas flow system for a millisecond anneal system according to example embodiments of the present disclosure.

FIG. 17 depicts a gas flow system 300 according to another example embodiment of the present disclosure. The gas flow system can include gas inlets 302 located in the top corners of the top chamber 202. In addition and/or in the alternative, the gas flow system 300 can include one or more gas inlets 340 positioned to allow the gas to enter opposite of a gate valve 350 (i.e., chamber door) on the level of the semiconductor substrate 60 proximate the wafer plane plate such that the gas flows across the substrate 60 towards the gate valve 350 and leaves the chamber either through vents 352 proximate the gate valve (e.g., on the gate valve flange) or through gas outlets 304 in the bottom chamber.

In some example implementations, the flow pattern can be adjusted for the different stages of the processing recipe by switching valves. For instance, during purge, all gas inlets— also the top gas inlets 302—are open for fast and efficient cleaning. During heat treatment, the top gas inlets 302 are closed and only the inlets 340 near the wafer plane 210 are on, generating a laminar flow regime across the substrate 60. In some embodiments, the processing chamber can include a linear array of gas inlets running along the sides opposite the gate valve and along the sides with the gate valve.

Figure 18C:
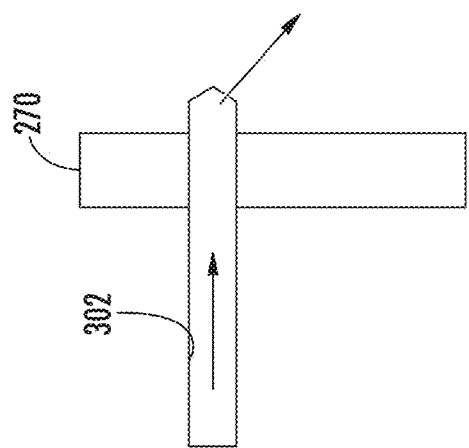
FIGS. 18(a)-18(c) depict example gas inlets according to example embodiments of the present disclosure.
Figure 18B:
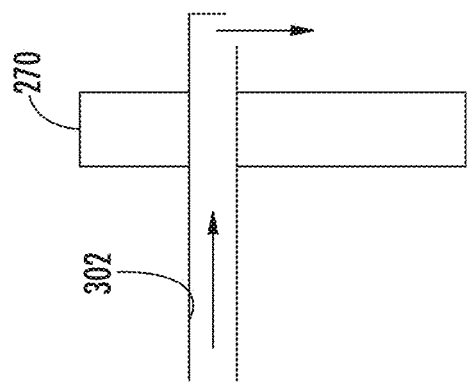
Figure 18A:
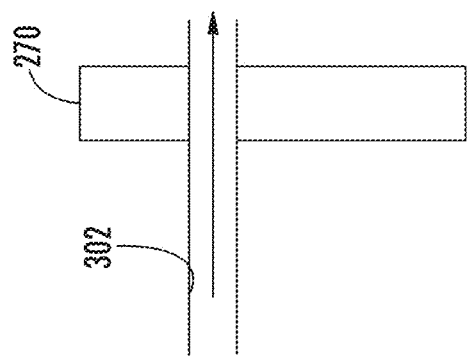

Another embodiment is to extend the plurality of gas inlets into the chamber by pipes penetrating the chamber wall mirrors. The pipe ends can have a straight open end, an opening perpendicular to the pipe axis, or other suitable shape. For instance, FIG. 18 depicts example gas inlets 302 having pipe ends that penetrate chamber wall mirrors 270 according to example embodiments of the present disclosure. FIG. 18(a) depicts a gas inlet 302 having a pipe with a straight open end. FIG. 18(b) depicts a gas inlet 302 having a pipe with an opening perpendicular to a pipe axis. FIG. 18(c) depicts a gas inlet 302 having a pipe with an opening that is at a non-perpendicular angle with respect to the pipe axis.

Example Gas Flow Pattern Improvement by Altering Gas Flow in Wafer Plane Plate

According to example embodiments of the present disclosure, the gas flow pattern inside a processing chamber of a millisecond anneal system can be improved by altering gas flow channels defined in a wafer plane plate connecting a top chamber and a bottom chamber in the millisecond anneal system. A process chamber in a millisecond anneal system can be divided by the wafer plane plate into a top chamber and a bottom chamber. To facilitate gas flow from the top chamber (where gas is entering the chamber) and the bottom chamber (where gas is vented from the chamber), each side of the wafer plane plate can include gas flow channels (e.g., slots).

Figure 19:
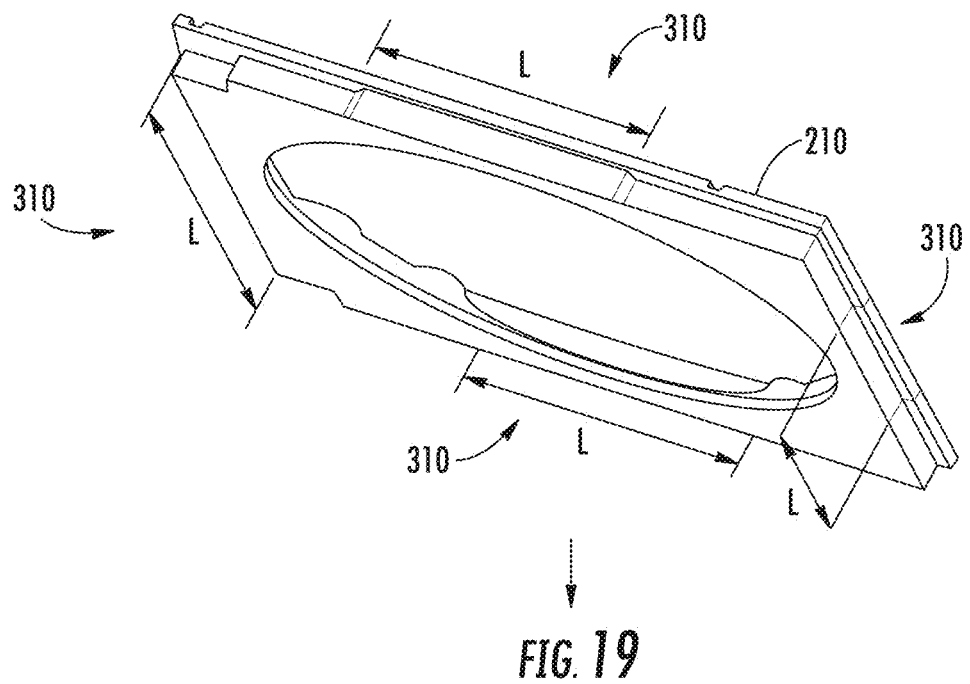
FIG. 19 depicts an example wafer plane plate with gas channels.

FIG. 19 depicts an example wafer plane plate 210 with gas channels 310 to facilitate gas flow between a top chamber and a bottom chamber of a millisecond anneal system according to example embodiments of the present disclosure. Each of the gas channels 310 has a length L. According to example embodiments of the present disclosure, the length of the gas channels 310 extends across the entire width W of the processing chamber as shown in FIG. 14.

Figure 20:
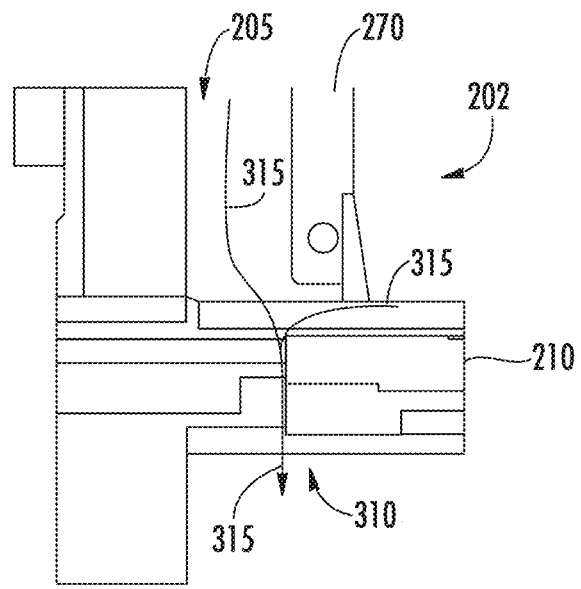
FIG. 20 depicts gas flow through gas channels in a wafer plane plate according to example embodiments of the present disclosure.

FIG. 20 depicts a cross-sectional view of a portion of the chamber showing gas channels 310 in the wafer plane plate 210. The arrows indicate the direction of gas flow 315 through the gas channels 310. As shown, there is also gas flow 315 in the space 205 behind the reflector mirrors 270 in the processing chamber.

According to example aspects of the present disclosure, the gas flow pattern in a millisecond anneal system can be improved by manipulating the size and the geometry of the gas channels. For instance, by modifying the length, the flow pattern in the corner of the chamber can be affected. With shorter channels, simulation shows that there is an upward flow in the corner of the chamber. Upward flow is thought to be responsible for poor purging and a re-distribution of particles in the chamber. However, extending the channel length to approximately the full width of the chamber according to example aspects of the present disclosure provides for an increase in downward flow in the corners.

Figure 21:
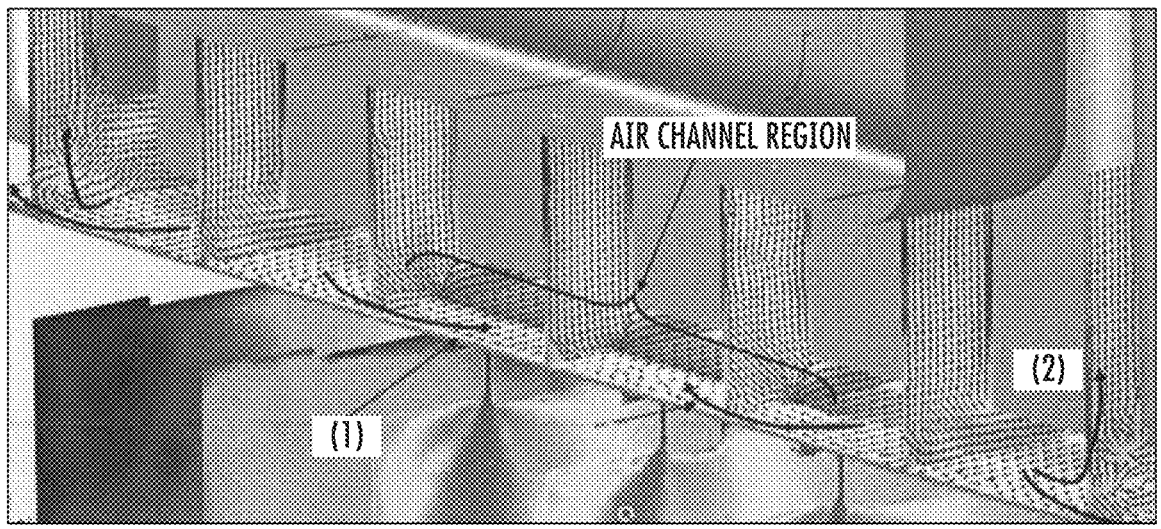
FIG. 21 depicts simulated gas flow through a millisecond anneal system.

For instance, FIG. 21 depicts a simulation of air flow behind the reflector mirror opposite a gate valve in a processing chamber with a wafer plane plate having a standard channel length. Over the channel, the gas moves towards the center of the panel and then down into the bottom chamber via the channel as shown at arrow (1). Outside of the channel, the gas moves to the corner of the chamber and extends upward as shown at arrow (2).

Figure 22:
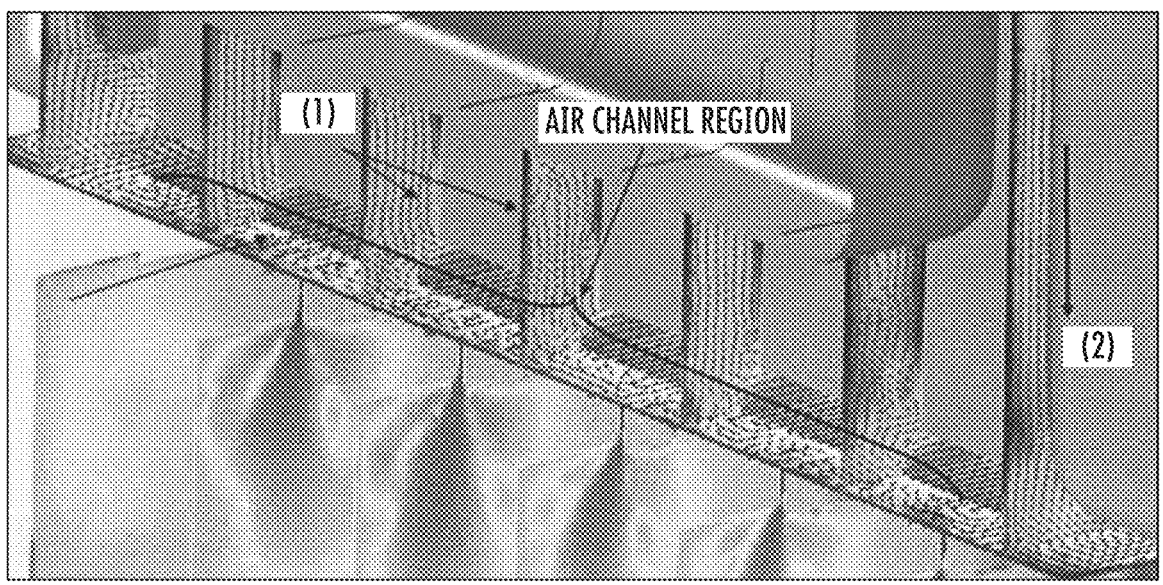
FIG. 22 depicts simulated gas flow through a millisecond anneal system having gas channels in a wafer plane plate according to example embodiments of the present disclosure.

FIG. 22 depicts airflow behind the reflector mirror opposite a gate valve in a processing chamber with a wafer plane plate having a channel length increased to the width of the chamber according to example embodiments of the present disclosure. As shown, air flow in the channel region is generally downward as indicated by arrows (1). In addition, air flow in the corners has changed from being predominately upward to now being downward as shown at arrow (2).

In some embodiments, a length of the channel in the wafer plane plate opposite the gate valve is extended to approximately the full width of the chamber. The channel length on the gate valve side of the chamber can also be the full width. The channels on the other sides of the chamber can remain shorter than the chamber width to allow mounting of the plate to the chamber frame. By pairwise matching of the flow resistance of the channels front and rear as well as left and right, the flow pattern can be made symmetric while at the same time providing for downward flow in all corners.

Figure 23:
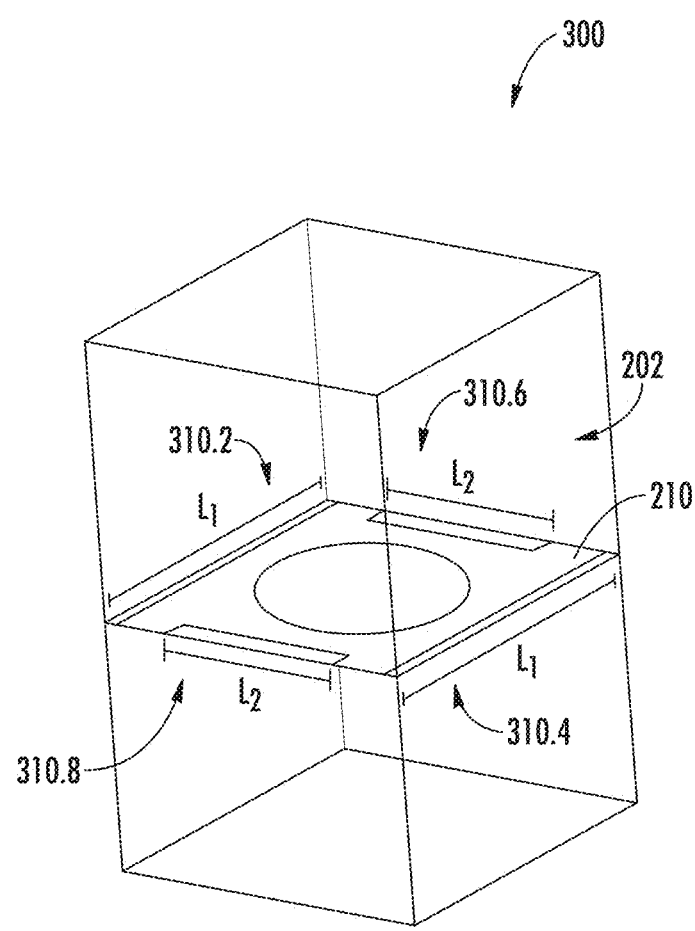
FIG. 23 depicts a gas flow system for a millisecond anneal system according to example embodiments of the present disclosure.

For example, FIG. 23 depicts an example gas flow system 300 according to example embodiments of the present disclosure. The gas flow system 300 includes channels 310.2, 310.4, 310.6, and 310.8 formed in the wafer plane plate 210. The channels 310.2 and 310.4 disposed opposite from one another have a length L1. The channels 310.6 and 310.8 disposed opposite from one another can have a length L2. The length L1 can be longer than the length L2. For instance, in some embodiments, the length L1 can be about the width of the processing chamber and the length L2 can be less than a width of the processing chamber.

Example Gas Flow Pattern Improvement by Addition of Liner Plate

According to example embodiments of the present disclosure, a gas flow pattern inside a processing chamber of a millisecond anneal system can be improved by decreasing the effective volume of the chamber through use of a liner plate above the semiconductor substrate. For instance, in one embodiment, a liner plate can be placed above the wafer plane plate for holding semiconductor substrate in spaced parallel relationship.

Figure 24:
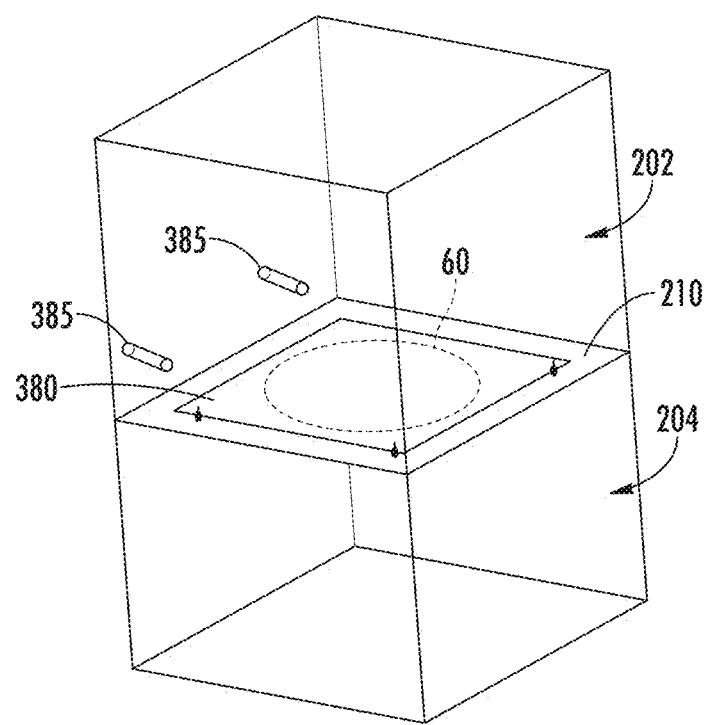
FIG. 24 depicts an example millisecond anneal system with an example liner plate according to example embodiments of the present disclosure.

FIG. 24 depicts an example liner plate 380 used in conjunction with millisecond anneal system according to example embodiments of the present disclosure. The liner plate 380 is disposed in spaced parallel relationship above the wafer plane plate 210. In some embodiments, the liner plate 380 can be a quartz liner plate.

In some embodiments, a distance between the wafer plane plate 210 and the liner plate 380 can be in the range of about 30 mm to about 60 mm. In some embodiments, the liner plate does not seal against the chamber walls, thus allowing process gas to flow into the volume below the plate, above the substrate 60. The liner plate 380 can generate a laminar flow regime around the substrate 60 by suppressing convection rolls and changing the flow vectors to be predominately parallel to the surface of the substrate 60. In some embodiments, additional gas inlets 385 can be located on the chamber wall in the region between the substrate 60 and the liner plate 380.

An additional effect of the liner plate 380 is that it can shield the chamber wall from contaminants released by the substrate 60. The liner plate 38—can be passively heated by the semiconductor substrate and the lamp radiation, effectively reducing the deposition probability compared to the cold chamber walls.

Another effect of the liner plate 380 is that it can reduce the effective purge volume. Impurity gas outside a shielded volume formed by the substrate 60 and the liner plate 380 can shielded. The leak-in rate of gas outside the shielded volume can be set by the gap between the liner plate perimeter and chamber wall.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A thermal processing system, comprising:
    a processing chamber comprising a top chamber separated from a bottom chamber by a wafer plane plate;
    a window defining a ceiling of the top chamber;
    a chamber wall of the top chamber disposed between the wafer plane plate and the window;
    a plurality of heat sources disposed at a location above the window, the plurality of heat sources configured to provide heat to a top surface of a substrate for the thermal treatment of the substrate;
    a plurality of gas inlets configured to inject gas into the top chamber;
    wherein the substrate is supported by the wafer plane plate;
    wherein at least one gas inlet of the plurality of gas inlets comprises a pipe penetrating through a reflective mirror disposed on the chamber wall of the top chamber;
    wherein at least one gas inlet of the plurality of gas inlets is positioned on a level of the substrate opposite a gate valve such that gas injected from the at least one gas inlet flows across the substrate towards the gate valve, the reflective mirror being disposed opposite the gate valve; and
    wherein the wafer plane plate comprises a gas channel to facilitate gas flow between the top chamber and the bottom chamber.

2. The thermal processing system of claim 1, wherein at least one of the plurality of gas inlets is positioned proximate to the wafer plane plate.

3. The thermal processing system of claim 1, wherein at least one of the plurality of gas inlets is positioned a first distance from the ceiling of the top chamber and a second distance from the wafer plane plate, the first distance being greater than the second distance.

4. The thermal processing system of claim 1, wherein at least one of the plurality of gas inlets is positioned opposite the gate valve proximate the wafer plane plate.

5. The thermal processing system of claim 4 further comprising a gas flow system, wherein the gas flow system comprises one or more vents positioned proximate to the gate valve.

6. The thermal processing system of claim 1, wherein the pipe has a straight open end.

7. The thermal processing system of claim 1, wherein the pipe has an opening perpendicular to a pipe axis.

8. The thermal processing system of claim 1, wherein the pipe has an opening that is at a non-perpendicular angle with respect to a pipe axis.

9. The thermal processing system of claim 1, wherein the processing chamber comprises a chamber frame.

10. The thermal processing system of claim 9, wherein the wafer plane plate is mounted to the chamber frame.

11. A millisecond anneal system, comprising:
    a processing chamber comprising a top chamber separated from a bottom chamber by a wafer plane plate;
    a window defining a ceiling of the top chamber;
    a chamber wall of the top chamber disposed between the wafer plane plate and the window;
    one or more arc lamps disposed at a location above the window, the one or more arc lamps configured to provide a flash to heat a top surface of a substrate for the thermal treatment of the substrate;
    one or more gas inlets configured to inject gas into the top chamber;
    wherein the substrate is supported by the wafer plane plate;
    wherein the wafer plane plate comprises a plurality of gas channels disposed on separate sides of the wafer plane plate, the plurality of gas channels each having a continuous length extending linearly across at least a portion of a width of the processing chamber, the plurality of gas channels each being disposed between the top chamber and the bottom chamber;
    wherein the plurality of gas channels comprises a first set of gas channels, the first set of gas channels each disposed on opposing sides of the wafer plane plate and a second set of gas channels each disposed on different opposing sides of the wafer plane plate; and
    wherein the first set of gas channels each have a first length, the second set of gas channels each have a second length less than the first length to allow mounting of the wafer plane plate.

12. The millisecond anneal system of claim 11, wherein the first length is equal to about the width of the processing chamber and the second length is less than the width of the processing chamber.

13. A millisecond anneal system, comprising:
    a processing chamber comprising a top chamber separated from a bottom chamber by a wafer plane plate;
    a window defining a ceiling of the top chamber;

a chamber wall of the top chamber disposed between the wafer plane plate and the window;

one or more arc lamps disposed at a location above the window, the one or more arc lamps configured to provide a flash to heat a top surface of a substrate for the thermal treatment of the substrate;

one or more gas inlets configured to inject gas into the top chamber; and a liner plate disposed above the substrate and below at least one gas inlet of the one or more gas inlets, the liner plate being disposed in parallel relationship to the substrate, the liner plate configured to generate a laminar flow regime above the substrate and below the liner plate;

wherein the substrate is supported by the wafer plane plate;

wherein the liner plate comprises quartz, the liner plate being positioned inside the processing chamber, the liner plate not sealed against the chamber wall of the top chamber, the liner plate being disposed to allow gas to flow into a volume below the liner plate;

wherein the liner plate comprises a perimeter surrounding the liner plate, the perimeter being separated from the chamber wall by a gap inside the processing chamber; and wherein at least one gas inlet of the one or more gas inlets is located on the chamber wall in a region between the substrate and the liner plate.

14. The millisecond anneal system of claim 6, wherein a distance between the wafer plane plate and the liner plate is in the range of about 30 mm to about 60 mm.

* * * * *